(12) United States Patent
Quinsat et al.

(10) Patent No.: US 9,779,835 B1
(45) Date of Patent: Oct. 3, 2017

(54) MAGNETIC MEMORY DEVICE

(71) Applicant: KABUSHIKI KAISHA TOSHIBA, Tokyo (JP)

(72) Inventors: Michael Arnaud Quinsat, Kanagawa (JP); Takuya Shimada, Kanagawa (JP); Hirofumi Morise, Kanagawa (JP); Masaki Kado, Kanagawa (JP); Yasuaki Ootera, Kanagawa (JP); Tsuyoshi Kondo, Kanagawa (JP); Shiho Nakamura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/438,856

(22) Filed: Feb. 22, 2017

(30) Foreign Application Priority Data

Aug. 9, 2016 (JP) ................................. 2016-156201

(51) Int. Cl.
*G11C 19/08* (2006.01)
*H01L 43/02* (2006.01)

(52) U.S. Cl.
CPC .......... *G11C 19/0841* (2013.01); *H01L 43/02* (2013.01)

(58) Field of Classification Search
CPC ............................ G11C 19/0841; H01L 43/02
USPC .......................................................... 365/87
See application file for complete search history.

(56) References Cited

U.S. PATENT DOCUMENTS

| | | | |
|---|---|---|---|
| 7,924,593 B2 | 4/2011 | Lee et al. | |
| 8,385,105 B2 | 2/2013 | Saito | |
| 8,385,107 B2 | 2/2013 | Prejbeanu | |
| 8,482,967 B2 | 7/2013 | Xi et al. | |
| 8,482,976 B2 | 7/2013 | Shibata | |
| 8,750,012 B1 | 6/2014 | Abraham et al. | |
| 9,293,183 B2 * | 3/2016 | Suzuki | G11C 11/161 |
| 2010/0054033 A1 | 3/2010 | Ochiai et al. | |

FOREIGN PATENT DOCUMENTS

JP 5437349 3/2014

OTHER PUBLICATIONS

J.C. Slonczewski, "Excitation of spin waves by an electric current", *Journal of Magnetism and Magnetic Materials*, 1999. L261-L268.
J.C. Slonczewski, "Excitation of spin waves by an electric current", *Journal of Magnetism and Magnetic Materiels*, 1999, L261-L268.

* cited by examiner

*Primary Examiner* — Fernando Hidalgo
(74) *Attorney, Agent, or Firm* — Finnegan, Henderson, Farabow, Garrett & Dunner, L.L.P.

(57) ABSTRACT

According to one embodiment, a magnetic memory device includes an element unit and a controller. The element unit includes a magnetic member, a first magnetic layer, a second magnetic layer, an intermediate layer, and a non-magnetic layer. The magnetic member includes a first region, a first portion, and a second portion. The first region is provided between the first portion and the second portion, or included in the first portion. The first magnetic layer is apart from the first region in a first direction. The second magnetic layer is provided between the first region and the first magnetic layer. The intermediate layer is provided between the first magnetic layer and the second magnetic layer. The intermediate layer is non-magnetic. The non-magnetic layer is connected with the first region. The controller is configured to supply a writing current and a shift current to the element unit.

20 Claims, 10 Drawing Sheets

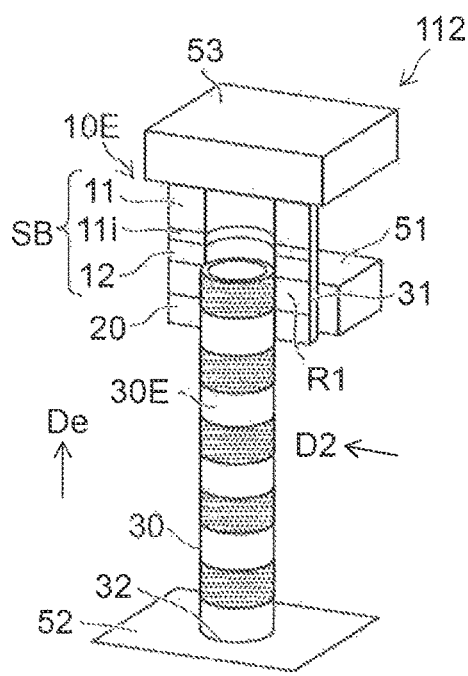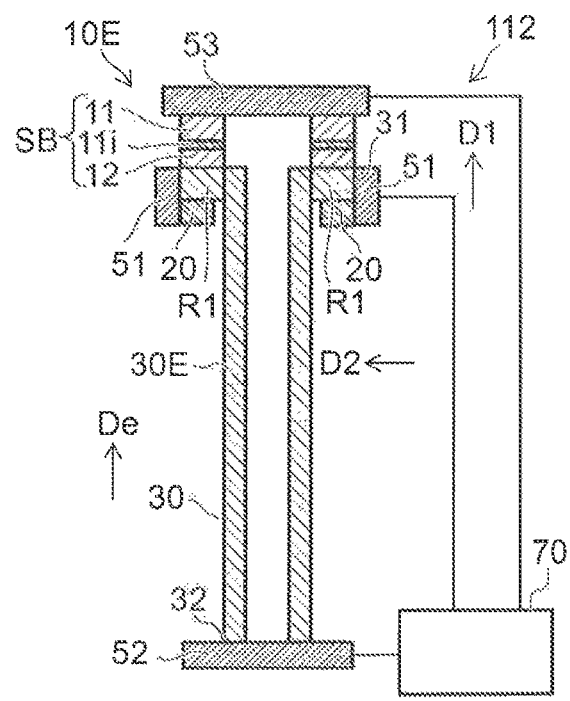
FIG. 10A  FIG. 10B
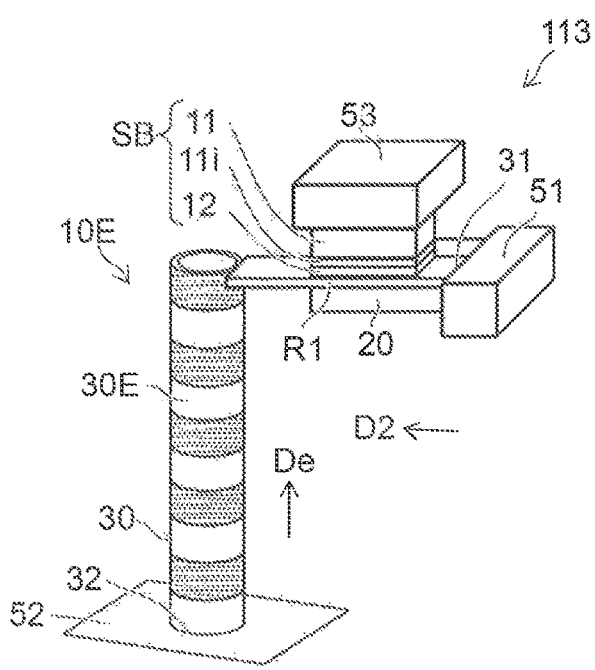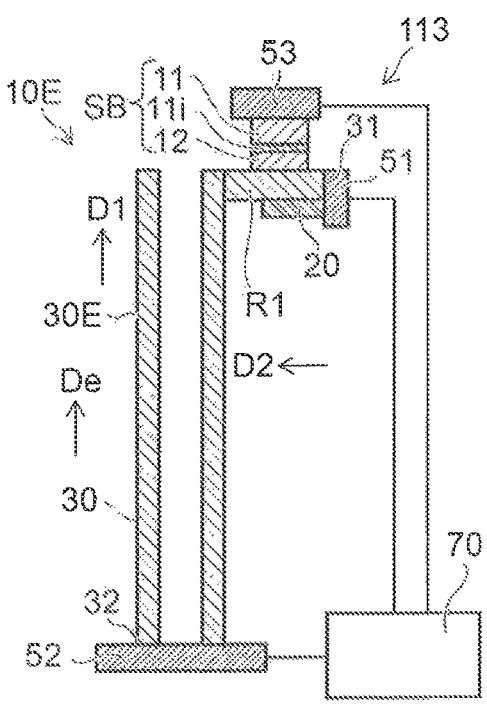
FIG. 11A  FIG. 11B

US 9,779,835 B1

MAGNETIC MEMORY DEVICE

CROSS-REFERENCE TO RELATED APPLICATIONS

This application is based upon and claims the benefit of priority from Japanese Patent Application No. 2016-156201, filed on Aug. 9, 2016; the entire contents of which are incorporated herein by reference.

Embodiments described herein relate generally to a magnetic memory device.

BACKGROUND

There is a magnetic memory device including the magnetic shift register using a magnetic body. Reduction of a writing current is demanded in the magnetic memory device.

BRIEF DESCRIPTION OF THE DRAWINGS

FIG. 10A and FIG. 10B are schematic views illustrating another magnetic memory device according to the first embodiment;

FIG. 11A and FIG. 11B are schematic views illustrating another magnetic memory device according to the first embodiment;

DETAILED DESCRIPTION

Figure 1:
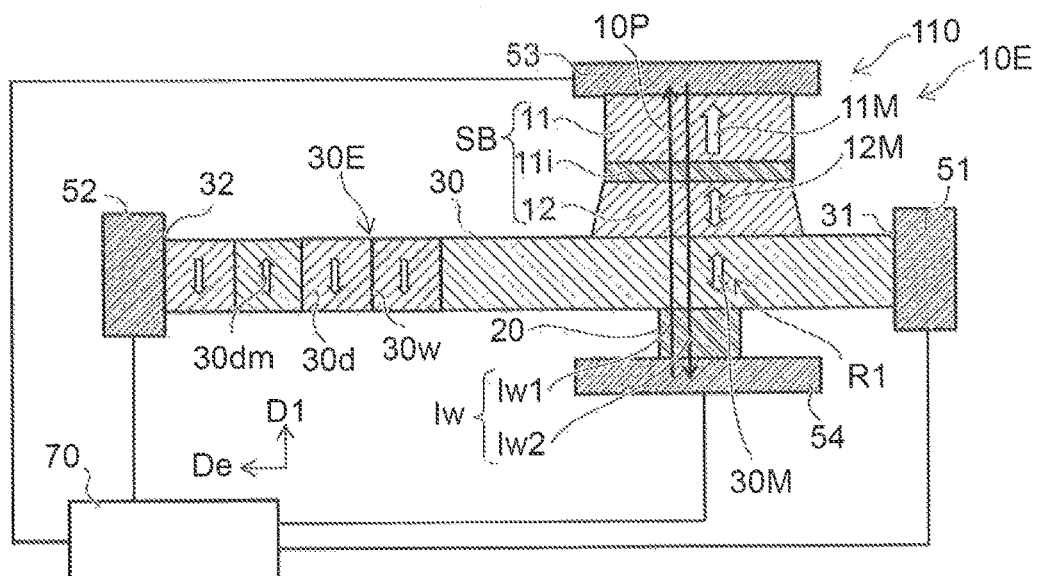
FIG. 1 is a schematic view illustrating the magnetic memory device according to a first embodiment.

According to one embodiment, a magnetic memory device includes an element unit and a controller. The element unit includes a magnetic member, a first magnetic layer, a second magnetic layer, an intermediate layer, and a non-magnetic layer. The magnetic member includes a first region, a first portion, and a second portion. The first region is provided between the first portion and the second portion, or the first region is included in the first portion. The first magnetic layer is apart from the first region in a first direction. The second magnetic layer is provided between the first region and the first magnetic layer. The intermediate layer is provided between the first magnetic layer and the second magnetic layer. The intermediate layer is non-magnetic. The non-magnetic layer is connected with the first region. The controller is configured to supply a writing current and a shift current to the element unit. The writing current passes a current path including the first magnetic layer and the non-magnetic layer. The shift current passes between the first portion and the second portion.

According to another embodiment, a memory device includes an element unit and a controller. The element unit includes a first conductive portion, a magnetic member, a first magnetic layer, a second magnetic layer, an intermediate layer, and a non-magnetic layer. The magnetic member includes a first region, a first portion, and a second portion. The first region is provided between the first portion and the second portion, or the first region is included in the first portion. The first magnetic layer is apart from the first region in a first direction. The second magnetic layer is provided between the first region and the first magnetic layer. The intermediate layer is provided between the first magnetic layer and the second magnetic layer. The intermediate layer is non-magnetic. The non-magnetic layer is provided between the first portion and the first conductive portion and electrically connected with the first portion and the first conductive portion. An electrical resistance of the non-magnetic layer with respect to a current passing between the first portion and the first conductive portion is higher than an electrical resistance of the magnetic member with respect to a current passing between the first portion and the second magnetic layer, and higher than an electrical resistance of the first conductive portion with respect to a current passing between the non-magnetic layer and the first conductive portion. The controller is electrically connected with the first magnetic layer and the first conductive portion. The controller is configured to supply a writing current to the element unit. The writing current passes a current path including the first magnetic layer and the first region.

According to another embodiment, a magnetic memory device includes an element unit and a controller. The element unit includes a magnetic member, a first magnetic layer, a second magnetic layer, an intermediate layer, a non-magnetic layer, and an insulating member. The first magnetic layer is apart from a first region of the magnetic member in a first direction. The second magnetic layer is provided between the first region and the first magnetic layer. The intermediate layer is provided between the first magnetic layer and the second magnetic layer. The intermediate layer is non-magnetic. The non-magnetic layer is connected with the first region. The insulating member is provided around the magnetic member, the first magnetic layer, the second magnetic layer, the intermediate layer, and the non-magnetic layer. A thermal conductivity of the non-magnetic layer is lower than a thermal conductivity of the insulating member. The controller is electrically connected with the first magnetic layer and the first region. The controller is configured to supply a writing current to the element unit. The writing current passes a current path including the first magnetic layer and the first region.

Embodiments of the invention will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the present specification and drawings, the same elements as those described previously with reference to earlier figures are labeled with same reference numerals, and the detailed description thereof is omitted as appropriate.

First Embodiment

FIG. 1 is a schematic view illustrating the magnetic memory device according to a first embodiment.

As shown in FIG. 1, a magnetic memory device 110 according to the embodiment includes an element unit 10E and a controller 70. FIG. 1 schematically illustrates a section of the element unit 10E.

The element unit 10E includes a magnetic member 30, a first magnetic layer 11, a second magnetic layer 12, an intermediate layer 11i, and a non-magnetic layer 20.

In this example, the magnetic member 30 includes a first portion 31, a second portion 32, and an extending portion 30E. The first portion 31 includes one end portion, for example. The second portion 32 includes another end portion. The extending portion 30E corresponds to a region between the first portion 31 and the second portion 32, for example. At least a part of the extending portion 30E extends along one direction (an extending direction De), for example.

In the magnetic member 30, a plurality of magnetic domains 30d can be formed. The magnetic member 30 can hold the plurality of magnetic domains 30d, for example. For example, a magnetic wall 30w is provided between the plurality of magnetic domains 30d. By the magnetic wall 30w, the plurality of magnetic domains 30d are divided. Each of the plurality of magnetic domains 30d has magnetization 30dm. In the plurality of magnetic domains 30d, the state (orientation) of the magnetization 30dm corresponds to information to be memorized. The magnetic member 30 becomes a memory portion, for example.

The magnetic member 30 includes a first region R1. The first region R1 is provided between the first portion 31 and the second portion 32, for example. Alternatively, as mentioned later, the first region R1 may be included in the first portion 31.

As mentioned later, the first region R1 corresponds to a portion in which writing is performed in the memory portion (the magnetic member 30), for example. In the first region R1, the writing of the information on the magnetic member 30 is performed. In the first region R1, the magnetization 30M of the magnetic member 30 is controlled.

The first magnetic layer 11 is apart from the first region R1 of the magnetic member 30 in a first direction D1. In this example, the first direction D1 crosses the extending direction De of the extending portion 30E. The first magnetic layer 11 has a first magnetization 11M.

The second magnetic layer 12 is provided between the first region R1 and the first magnetic layer 11. The second magnetic layer 12 has a second magnetization 12M.

The intermediate layer ill is provided between the first magnetic layer 11 and the second magnetic layer 12. The intermediate layer 11i is non-magnetic. The first magnetic layer 11, the second magnetic layer 12, and the intermediate layer 11i are included in a stacked body SB. The stacked body SB is a magneto-resistive effect element, for example. In the stacked body SB, GMR (Giant Magneto Resistive effect) or TMR (Tunnel Magneto Resistance Effect) occurs. As mentioned later, the stacked body SB writes information in the first region R1 of the magnetic member 30, for example. As mentioned later, the stacked body SB reads the information memorized in the magnetic member 30, for example.

The non-magnetic layer 20 is connected with the first region R1. The non-magnetic layer 20 contacts at least a part of the first region R1, for example. The non-magnetic layer 20 is provided near the first region R1. For example, the distance (shortest distance) between the non-magnetic layer 20 and the first region R1 is not more than the distance between the first magnetic layer 11 and the first region R1.

In this example, the position of the first region R1 in the first direction D1 is located between the position of the non-magnetic layer 20 in the first direction D1 and the position of the second magnetic layer 12 in the first direction D1. In this example, at least a part of the first region R1 is located between the non-magnetic layer 20 and the second magnetic layer 12

In this example, the controller 70 is electrically connected with the first magnetic layer 11 and the non-magnetic layer 20.

In this example, first to fourth conductive portions 51-54 are provided. These conductive portions function as an electrode, for example. These conductive portions may also include interconnect. The first conductive portion 51 is electrically connected with the first portion 31 of the magnetic member 30. The second conductive portion 52 is electrically connected with the second portion 32 of the magnetic member 30. The third conductive portion 53 is electrically connected with the first magnetic layer 11. The fourth conductive portion 54 is electrically connected with the non-magnetic layer 20. The magnetic member 30, the first magnetic layer 11, the second magnetic layer 12, and the non-magnetic layer 20 are conductive.

In this example, the controller 70 is electrically connected with the first portion 31, the second portion 32, the first magnetic layer 11, and the non-magnetic layer 20 through the first to fourth conductive portions 51-54, respectively.

The controller 70 performs a writing operation. The controller 70 supplies a writing current Iw to the element unit 10E in the writing operation. The writing current Iw flows through a current path 10P. The current path 10P includes the first magnetic layer 11 and the non-magnetic layer 20. In this example, the current path 10P includes the first magnetic layer 11, the intermediate layer 11i, the second magnetic layer 12, and the non-magnetic layer 20.

The writing current Iw includes a first writing current Iw1 and a second writing current Iw2, for example. The first writing current Iw1 flows from the non-magnetic layer 20 toward the first magnetic layer 11 along the current path 10P. The second writing current Iw2 flows from the first magnetic layer 11 toward the non-magnetic layer 20 along the current path 10P. Depending on the direction of the writing current Iw, the information written in the magnetic member 30 (the first region R1) is changed.

For example, in the writing operation, the information of one of "0" and "1" is written by the first writing current Iw1. The information of the other one of "0" and "1" is written by the second writing current Iw2. For example, depending on the direction of the writing current Iw, the direction of the magnetization 30M of the first region R1 can be controlled.

In the embodiment, such the writing current Iw passes the non-magnetic layer 20. It has been found that the writing current Iw can be decreased by this configuration.

For example, when the writing current Iw flows in the non-magnetic layer 20, the temperature of the first region R1 connected to the non-magnetic layer 20 is locally increased. By the increase of the temperature, it becomes easy to change the magnetization 30M of the first region R1. Thereby, the writing operation becomes easy. For example, the writing current Iw can be reduced.

As mentioned later, in the magnetic memory device 110 according to the embodiment, it is considered that the orientation of the second magnetization 12M of the second magnetic layer 12 is changed depending on the direction of the writing current Iw, for example. By the action of the second magnetization 12M, it is considered that the orientation of the magnetization 30M of the first region R1 is changed. The writing current Iw flows also in the non-magnetic layer 20. It is considered that the temperature of the first region R1 is locally increased by the heat which is generated in the non-magnetic layer 20 and the orientation of the magnetization 30M of the first region R1 changes easily.

For example, a first reference example is conceived in which the first region R1 of the magnetic member 30 is provided between two magnetic layers, and the writing current flows in the magnetic member 30 through these two magnetic layers. In the first reference example, non-magnetic intermediate layers are provided between each of two magnetic layers and the magnetic member 30. In this case, depending on the direction of the writing current, it is considered that the orientation of the magnetization 30M of the first region R1 is changed. However, in such first reference example, the orientation of the magnetization 30M of the first region R1 is directly changed by the writing current Iw. In this case, a large writing current is required to change the orientation of magnetization of the magnetization 30M.

In contrast, in the embodiment, the writing current Iw is supplied also in the non-magnetic layer 20. Thereby, the temperature of the first region R1 is locally increased. Therefore, it is considered that the writing current Iw can be reduced compared with the above-mentioned first reference example.

Furthermore, in the embodiment, the stacked body SB including two magnetic layers (the first magnetic layer 11 and the second magnetic layer 12) is provided. As mentioned later, the orientation of the second magnetization 12M of the second magnetic layer 12 is changed by the writing current Iw, for example, and the magnetization 30M of the first region R1 of the magnetic member 30 is controlled by the second magnetization 12M. By such a special structure (the structure using the stacked body SB), the writing current Iw can be further decreased.

A second reference example is conceivable in which the non-magnetic layer 20 according to embodiment is not provided. In this case, it is considered that a case may exist where the temperature of the first region R1 is increased by the writing current Iw. However, in this case, the writing current Iw to reach the desirable temperature becomes larger than the case of the embodiment having the non-magnetic layer 20. Thereby, not only the first region R1 but also the stacked body SB becomes affected by the large writing current Iw. Therefore, the operation easily becomes unstable.

In contrast, in the embodiment, the non-magnetic layer is provided independently in addition to the stacked body SB and the magnetic member 30. The temperature of the first region R1 increases due to the increase of the temperature of the non-magnetic layer 20. The increase in heat in the non-magnetic layer 20 and the control of the magnetization in the stacked body SB are controlled independently. Thereby, more stable operation can be performed.

A third reference example is conceivable in which a portion to perform the writing is provided between a heat source and the magnetic member 30. In the third reference example, magnon acts on the magnetic member 30 from the portion to perform the writing. In the third reference example, the heat source is separated from the magnetic member 30. Therefore, when increasing the temperature of the magnetic member 30, the temperature of the portion to perform the writing increases too much. Therefore, the operation becomes unstable easily.

In contrast, in the embodiment, the non-magnetic layer 20 is connected to the first region R1 of the magnetic member 30. The stacked body SB is not provided between the non-magnetic layer 20 and the magnetic member 30. Therefore, it is easy to stabilize the operation of the stacked body SB. The stable operation is obtained.

On the other hand, a fourth reference example is conceivable in which the magnetization 30M of the magnetic member 30 is controlled by a current magnetic field (a magnetic field based on a current). In the fourth reference example, a structure is conceivable in which a heater to increase the temperature of the portion to perform the writing is provided. However, in the fourth reference example using the current magnetic field, it is difficult to reduce the writing current. Furthermore, since a current magnetic field spreads in large space, it is difficult to reduce the size of a recording bit, and increase of memory density is limited.

In contrast, in the embodiment, the magnetization 30M of the first region R1 of the magnetic member 30 is controlled by the action of the stacked body SB. Thereby, the writing current Iw is reduced. And memory density can be increased.

FIG. 2A to FIG. 2F are schematic sectional views illustrating the writing operation in the magnetic memory device according to the first embodiment.

Figure 2A:
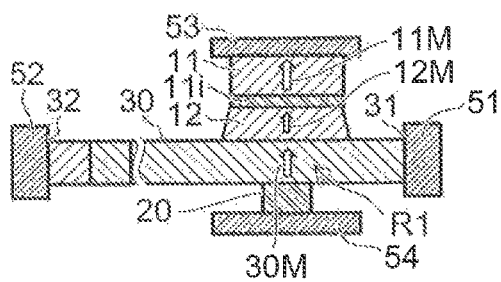
FIG. 2A to FIG. 2F are schematic sectional views illustrating the writing operation in the magnetic memory device according to the first embodiment.
Figure 2D:
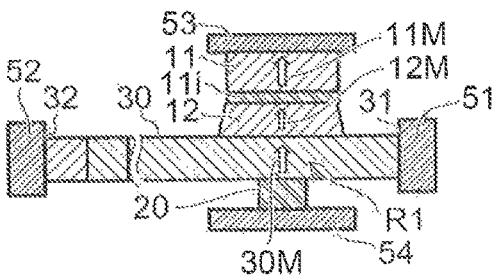
Figure 2B:
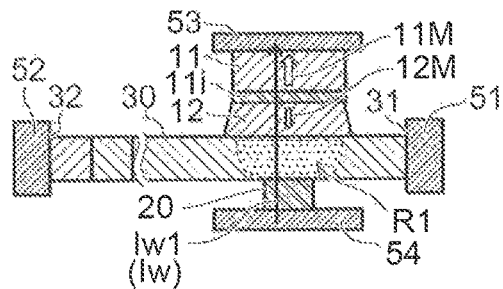
Figure 2E:
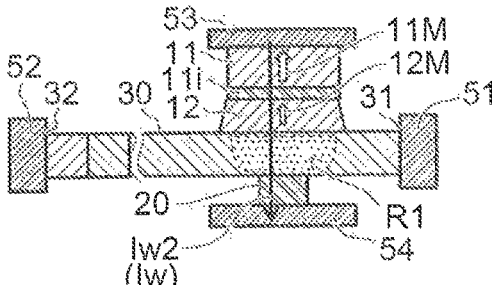
Figure 2C:
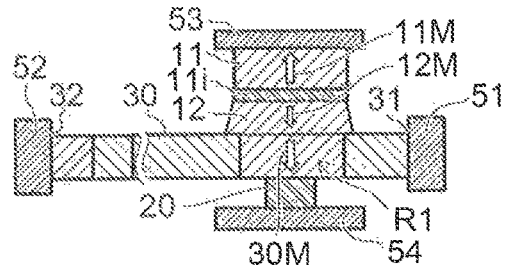
Figure 2F:
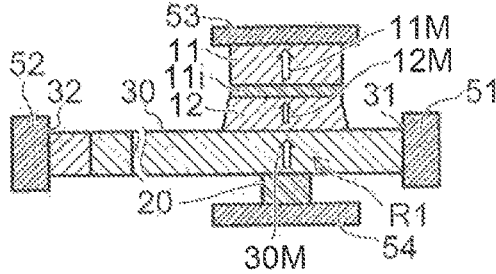

FIG. 2A to FIG. 2C correspond to an operation to form one of written states. FIG. 2D to FIG. 2F correspond to another operation to form another one of written states. In the following explanation, the first magnetization 11M of the first magnetic layer 11 is "upward." The first magnetization 11M of the first magnetic layer 11 may be "downward". In this case, the "orientation" in the following explanation is reversed.

As shown in FIG. 2A, in an initial state, the second magnetization 12M of the second magnetic layer 12 is "upward." The magnetization 30M of the first region R1 of the magnetic member 30 is also "upward." The direction of the magnetization 30M is the same as the direction of the second magnetization 12M. As already recited, the first magnetization 11M of the first magnetic layer 11 is "upward."

As shown in FIG. 2B, the first writing current Iw1 is supplied in this state. The first writing current Iw1 flows through the fourth conductive portion 54, the non-magnetic layer 20, the first region R1, the second magnetic layer 12, the intermediate layer 11i, the first magnetic layer 11, and the third conductive portion 53 in this order. By the first writing current Iw1, the magnetization in the first region R1 substantially disappears. This is because the temperature of the first region R1 is increased. And the direction of the second magnetization 12M of the second magnetic layer 12 is reversed. The second magnetization 12M becomes "downward."

Then, the supply of first writing current Iw1 is stopped. The temperature of the first region R1 decreases. The second magnetization 12M of the second magnetic layer 12 acts on the first region R1.

As a result, as shown in FIG. 2C, the orientation of the magnetization 30M of the first region R1 becomes the same as the orientation of the second magnetization 12M. In FIG. 2C, the magnetization 30M and the second magnetization 12M are "downward." The magnetization 30M is reversed from the initial state. Thereby, one writing operation (one of writings "0" and "1") is performed.

On the other hand, as shown in FIG. 2D, in an initial state, the second magnetization 12M of the second magnetic layer 12 is "upward." The magnetization 30M of the first region R1 of the magnetic member 30 is also "upward." The direction of the magnetization 30M is the same as the direction of the second magnetization 12M. As already recited, the first magnetization 11M of the first magnetic layer 11 is "upward."

As shown in FIG. 2E, in this state, the second writing current Iw2 is supplied. The second writing current Iw2 flows through the third conductive portion 53, the first magnetic layer 11, the intermediate layer 11i, the second magnetic layer 12, the first region R1, the non-magnetic layer 20, and the fourth conductive portion 54 in this order. By the second writing current Iw2, the magnetization in the first region R1 substantially disappears. This is because the temperature of the first region R1 is increased. And an "upward" is maintained in the second magnetization 12M of the second magnetic layer 12.

Then, the supply of second writing current Iw2 is stopped. The temperature of the first region R1 decreases. The second magnetization 12M of the second magnetic layer 12 acts on the first region R1.

As a result, as shown in FIG. 2F, the orientation of the magnetization 30M of the first region R1 becomes the same as the orientation of the second magnetization 12M. In FIG. 2F, the magnetization 30M and the second magnetization 12M are "upward". The magnetization 30M maintains the initial state. Thereby, one writing operation (the other of writings "0" and "1") is performed.

Thus, in the embodiment, the magnetization 30M of the first region R1 changes depending on the direction of the writing current Iw. In the above, one of two kinds of the writing operations may be regarded as an erasing operation.

FIG. 3A to FIG. 3E are timing charts illustrating the writing operation in the magnetic memory device according to the first embodiment.

The horizontal axis of these figured is the time "t". FIG. 3 A shows the writing current Iw. The writing current Iw is the first writing current Iw1 or the second writing current Iw2. The polarity of the second writing current Iw2 is opposite to the polarity of the first writing current Iw1. FIG. 3B shows change of the second magnetization 12M of a second magnetic layer. "−1" corresponds to either one of "upward" and "downward", for example. "+1" corresponds to another one of "upward" and "downward", for example. FIG. 3C shows a change of the temperature Temp of the first region R1. FIG. 3D and FIG. 3E show change of the magnetization 30M of the first region R1. FIG. 3D corresponds to a case where the temperature Temp of the first region R1 exceeds the Curie temperature Tc of the magnetic member 30 (° C.). FIG. 3E corresponds to a case where the magnetic member 30 is superparamagnetic.

Figure 3A:
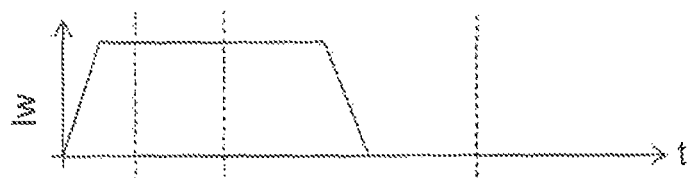
FIG. 3A to FIG. 3E are timing charts illustrating the writing operation in the magnetic memory device according to the first embodiment.
Figure 3B:
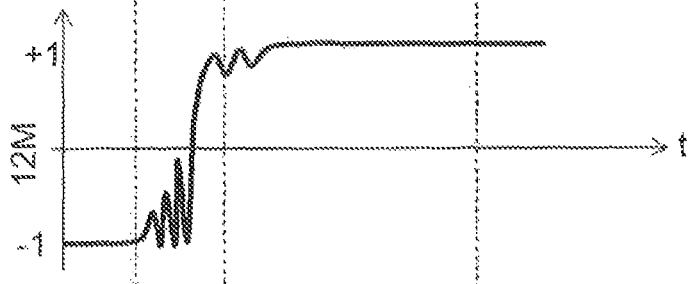
Figure 3C:
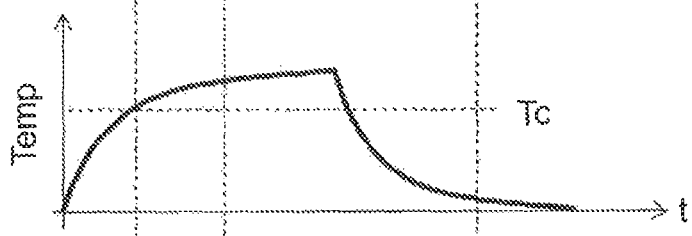
Figure 3D:
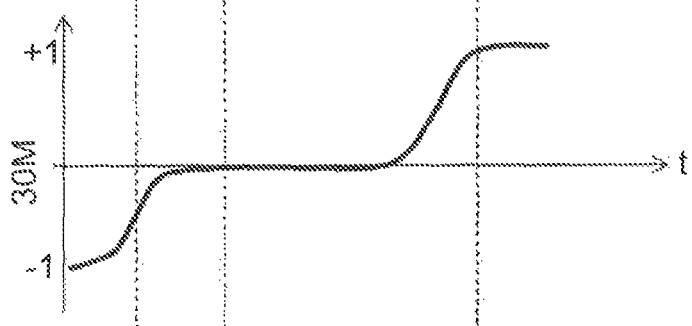
Figure 3E:
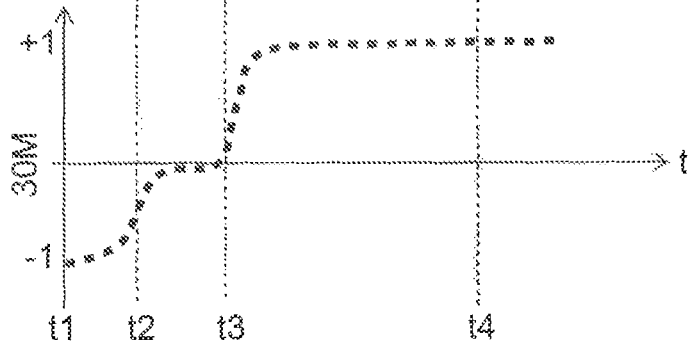

As shown in FIG. 3A, in the first time t1, a supply of the writing current Iw starts. The writing current Iw is pulse-like.

As shown in FIG. 3B, at the first time t1, the second magnetization 12M is in the state of "−1." At the second time t2, the second magnetization 12M begins to change. This change is based on the writing current Iw. This is possible thanks to the spin transfer torque provided by the stacked body SB structure for example. At the third time t3, the second magnetization 12M becomes to be substantially in the state of "+1". Thus, the reversal of the second magnetization 12M occurs by the pulse of the writing current Iw.

As shown in FIG. 3C, after the first time t1, the temperature Temp of the first region R1 increases. And after the end of the pulse of the writing current Iw, the temperature Temp is decreased. After the fourth time t4, the temperature Temp returns to the initial state substantially.

As shown in FIG. 3D, at the first time t1, the magnetization 30M of the first region R1 is in the state of "−1." The orientation of the magnetization 30M is the same as that of the second magnetization 12M. For example, after the second time t2, the magnetization 30M becomes substantially 0. A demagnetization occurs. The demagnetization is based on the increase of the temperature Temp of the second domain R1. Then, when the temperature Temp decreased, the magnetization 30M moves to the state of "+1". A re-magnetization occurs. For example, a leak magnetic field from the second magnetization 12M of the second magnetic layer 12 acts on the first region R1. The re-magnetization occurs by the leak magnetic field. Thus, the magnetization 30M of the first region R1 is reversed from the initial state.

As shown in FIG. 3E, in the case where the magnetic member 30 is superparamagnetic, in a period from the second time t2 to the third time t3, the magnetization 30M is substantially 0. After the third time t3, the magnetization 30M moves to the state of "+1". Also in this case, the magnetization 30M of the first region R1 is reversed from the initial state.

Thus, in the embodiment, it is considered that the second magnetization 12M of the second magnetic layer 12 changes and the magnetization 30M of the first region R1 changes according to the change of the second magnetization 12M.

In the above, the case is described where the temperature Temp of the first region R1 exceeded the Curie temperature Tc of the magnetic member 30 (° C.). In the embodiment, the temperature Temp is not needed to exceed the Curie temperature Tc (° C.). Also in a case where the temperature Temp is below the Curie temperature Tc (° C.), the magnetization 30M of the first region R1 changes easily. Therefore, also in a case temperature Temp is below the Curie temperature Tc (° C.), the writing current Iw can be reduced.

For example, in at least a part of a writing operation (a period when the writing current Iw flows), the temperature (° C.) of the first region R1 Is not less than 0.5 times of the Curie temperature (° C.) of the magnetic member 30. Thereby, the change of the magnetization 30M of the first region R1 can become easy, and the writing current Iw can be reduced. The temperature (° C.) of the first region R1 may be not less than 0.75 times the Curie temperature (° C.) of the magnetic member 30. The temperature (° C.) of the first region R1 may be not less than the Curie temperature (° C.) of the magnetic member 30.

Hereinafter, the example of a shift operation which is performed in the magnetic memory device 110 according to embodiment is described.

FIG. 4A to FIG. 4F are schematic views illustrating a shift operation in the magnetic memory device according to the first embodiment.

Figure 4A:
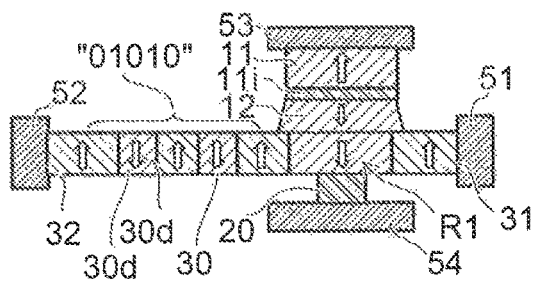
FIG. 4A to FIG. 4F are schematic views illustrating a shift operation in the magnetic memory device according to the first embodiment.
Figure 4D:
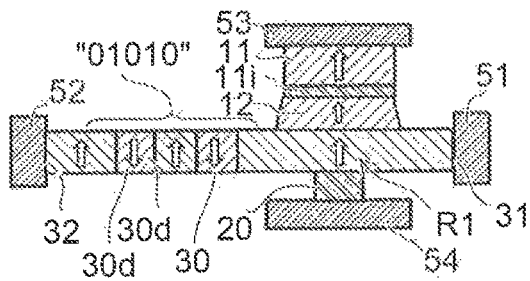
Figure 4B:
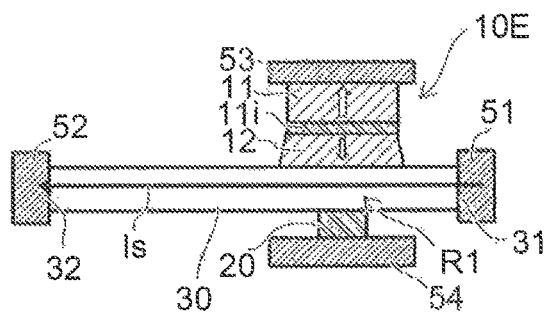
Figure 4E:
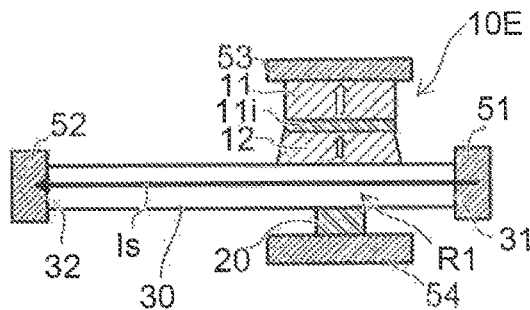
Figure 4C:
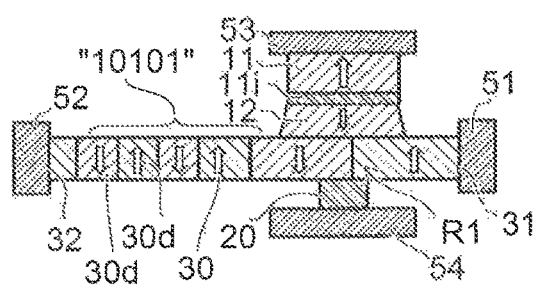
Figure 4F:
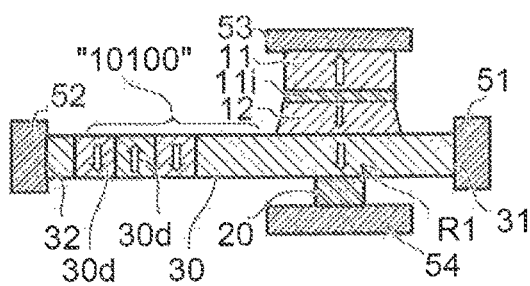

FIG. 4A to FIG. 4C correspond to a first case. FIG. 4D to FIG. 4F correspond to a second case.

As shown in FIG. 4A, information is held in the plurality of magnetic domains 30d of the magnetic member 30. A state of the magnetization 30dm of the magnetic domains 30d being in "downward" is taken as "1." A state of the magnetization 30dm of the magnetic domains 30d being in "upward" is taken as "0." In this example, the information of "01010" is held (memorized) in the magnetic member 30. The magnetization 30M of the first region R1 is downward. The first region R1 corresponds to "1."

As shown in FIG. 4B, the shift current Is flows in the magnetic member 30 in the shift operation. The shift current Is is supplied by the controller 70 (see FIG. 1), for example. The controller 70 supplies the shift current Is to the element unit 10E in the shift operation. The shift current Is flows between the first portion 31 and the second portion 32. In this example, the shift current Is flows from the first portion 31 toward the second portion 32. Then the supply of the shift Is (shift pulse) is stopped.

As shown in FIG. 4C, the information held in the magnetic member 30 moves. For example, new information enters in the magnetic member 30 (magnetic register). For example, the information of "1" is written in the magnetic register. For example, the information of "10101" is held in the magnetic member 30. In the second portion 32, the information is set to "0". Or the information is deleted in the second portion 32.

As shown in FIG. 4D, the information of "01010" is held (memorized) in the magnetic member 30. The magnetization 30M of the first region R1 is upward. The first region R1 corresponds to "0."

As shown in FIG. 4E, the controller 70 supplies the shift current Is to the element unit 10E in the shift operation. The shift current Is flows from the first portion 31 toward the second portion 32.

As shown in FIG. 4F, the information held in the magnetic member 30 moves. For example, new information enters in the magnetic member 30 (magnetic register). For example, the Information of "O" is written in the magnetic register. For example, the information of "10100" is held in the magnetic member 30. In the second portion 32, the information is set to "0". Or the information is deleted in the second portion 32.

Thus, the magnetic member 30 functions as a shift register. The information memorized in the magnetic member moves by the shift current Is on the magnetic member 30. The movement of information is performed by the shift current Is. Extraction (reading) of information is performed by the shift current Is.

Hereinafter, the example of a reading operation in the magnetic memory device 110 according to embodiment is described.

Figure 5A:
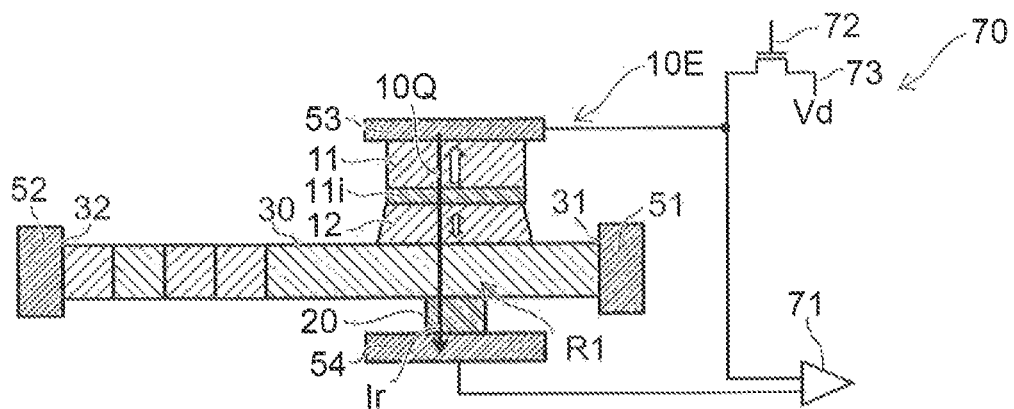
FIG. 5A to FIG. 5C are schematic views illustrating the reading operation in the magnetic memory device according to the first embodiment.
Figure 5B:
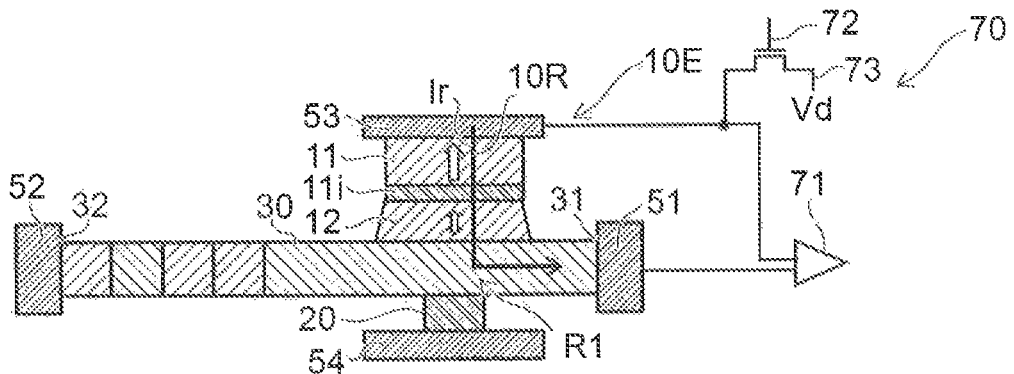
Figure 5C:
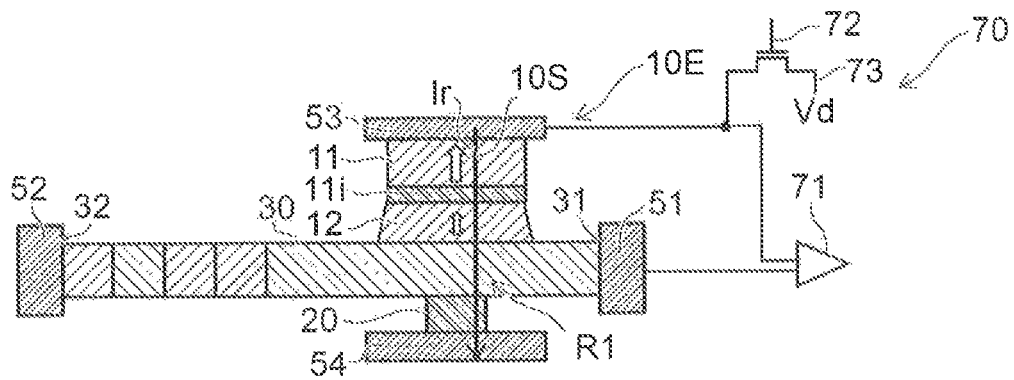

FIG. 5A to FIG. 5C are schematic views illustrating the reading operation in the magnetic memory device according to the first embodiment.

As shown in FIG. 5A, in one example, the third conductive portion 53 is electrically connected with one input of the amplifier 71. The fourth conductive portion 54 is electrically connected with another input of the amplifier 71. The third conductive portion 53 is further electrically connected to the power supply 73 through the transistor 72. The potential of the power supply 73 is "potential Vd". The amplifier 71 and the transistor 72 are included in the controller 70.

The reading current Ir is supplied to the element unit 10E from the controller 70. The reading current Ir flows through the current path 10Q. The current path 10Q includes the first magnetic layer 11 and the non-magnetic layer 20. In this example, the current path 10Q includes the third conductive portion 53, the first magnetic layer 11, the Intermediate layer 11i, the second magnetic layer 12, the first region R1, the non-magnetic layer 20, and the fourth conductive portion 54. The reading current Ir is smaller than the writing current Iw.

The electrical resistance of the current path 10Q is detected by such reading current Ir. For example, the electrical resistance of the stacked body SB changes based on GMR or TMR. For example, the electrical resistance changes based on the relative relation between the second magnetization 12M of the second magnetic layer 12 and the first magnetization 11M of the first magnetic layer 11. As already recited, the orientation of the magnetization 30M of the first region R1 is interlocked with the orientation of the second magnetization 12M of the second magnetic layer 12. Therefore, the change of resistance of the stacked body SB corresponds to the state of the magnetization 30M of the first region R1. Thereby, the state held in the magnetic member 30 can be read.

As shown in FIG. 5B, in another example, the third conductive portion 53 is electrically connected with one input of the amplifier 71. And the first conductive portion 51 is electrically connected with another input of the amplifier 71. The third conductive portion 53 is further electrically connected to the power supply 73 through the transistor 72. The reading current Ir is supplied to the element unit 10E from the controller 70. The reading current Ir flows through the current path 10R in this example. The current path 10R includes the first magnetic layer 11 and the first region R1. In this example, the current path 10R includes the third conductive portion 53, the first magnetic layer 11, the intermediate layer 11i, the second magnetic layer 12, the first region R1, and the first conductive portion 51. Also in this case, the reading current Ir is smaller than the writing current Iw.

Also in this case, the electrical resistance of the current path 10R including the stacked body SB is detected by the reading current Ir. Thereby, the state held in the magnetic member 30 can be read.

As shown in FIG. 5C, in another example, the third conductive portion 53 is electrically connected with one input of the amplifier 71. And the first conductive portion 51 is electrically connected with another input of the amplifier 71. The third conductive portion 53 is further electrically connected to the power supply 73 through the transistor 72. The reading current Ir is supplied to the element unit 10E from the controller 70. The reading current Ir flows through the current path 10S in this example. The current path 10S includes the first magnetic layer 11 and the first region R1. In this example, the current path 10S includes the third conductive portion 53, the first magnetic layer 11, the intermediate layer 11i, the second magnetic layer 12, the first region R1, the non-magnetic layer 20 and the fourth conductive portion 54. Also in this case, the reading current Ir is smaller than the writing current Iw.

Also in this case, the electrical resistance of the current path 10S including the stacked body SB is detected by the reading current Ir. Thereby, the state held in the magnetic member 30 can be read.

Figure 6A:
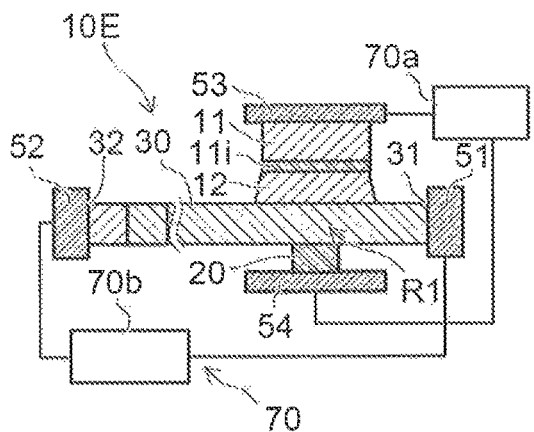
FIG. 6A and FIG. 6B are schematic views illustrating the magnetic memory devices according to the first embodiment.
Figure 6B:
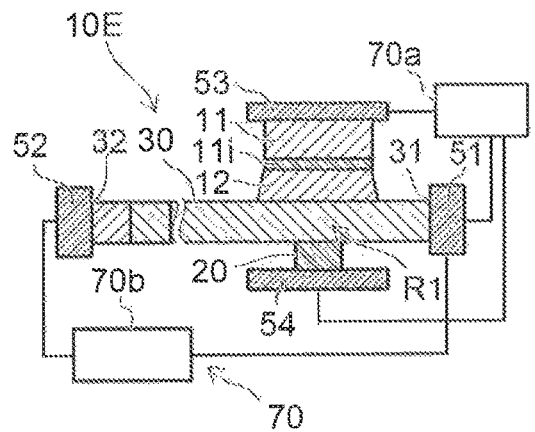

FIG. 6A and FIG. 6B are schematic views illustrating the magnetic memory devices according to the first embodiment.

As shown in FIG. 6A, the controller 70 may also include the first control circuit 70*a* and the second control circuit 70*b*. The first control circuit 70*a* controls the reading/writing operation. The second control circuit 70*b* controls the shift operation. In this example, the first control circuit 70*a* is electrically connected with the third conductive portion 53 and the fourth conductive portion 54. The second control circuit 70*b* is electrically connected with the first conductive portion 51 and the second conductive portion 52.

Also in the example shown in FIG. 6B, the controller 70 includes the first control circuit 70*a* and the second control circuit 70*b*. In this example, the first control circuit 70*a* is electrically connected with the first conductive portion 51, the third conductive portion 53, and the fourth conductive portion 54.

In the examples shown in FIG. 6A and FIG. 6B, the element unit 10E has a four terminal configuration. As already recited, the element unit 10E includes the first conductive portion 51, the second conductive portion 52, the third conductive portion 53, and the fourth conductive portion 54. The controller 70 is electrically connected with the first to fourth conductive portions 51-54.

FIG. 7A to FIG. 7F are schematic views illustrating other magnetic memory devices according to the first embodiment.

Figure 7A:
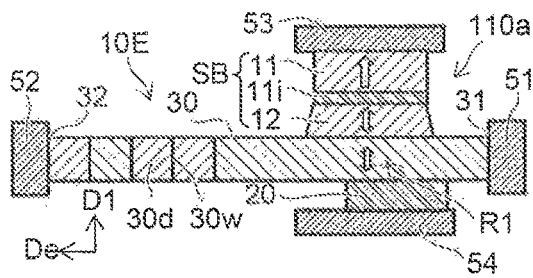
FIG. 7A to FIG. 7F are schematic views illustrating other magnetic memory devices according to the first embodiment.

As illustrates in FIG. 7A, in the magnetic memory device 110*a*, a part of second magnetic layer 12 overlaps the non-magnetic layer 20 in the first direction D1. Another part of the second magnetic layer 12 does not overlap the non-magnetic layer 20 in the first direction D1.

Figure 7B:
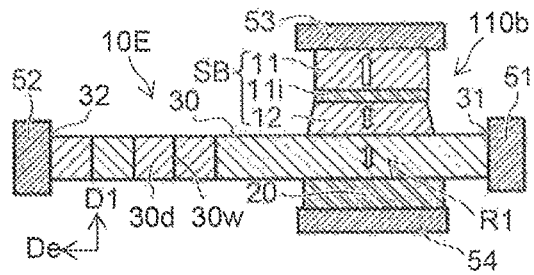

As shown in FIG. 7B, in the magnetic memory device 110*b*, the whole of the second magnetic layer 12 substantially overlaps the non-magnetic layer 20 in the first direction D1.

Figure 7C:
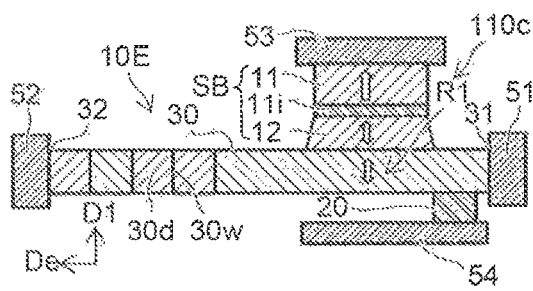

As shown in FIG. 7C, in the magnetic memory device 110*c*, the second magnetic layer 12 does not overlap the non-magnetic layer 20 in the first direction D1.

Figure 7D:
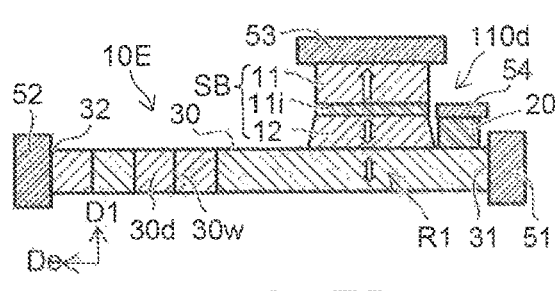

As shown in FIG. 7D, in the magnetic memory device 110*d*, at least a part of the non-magnetic layer 20 overlaps the first magnetic layer 12 in a direction (for example, extending direction De) crossing the first direction D1.

Figure 7E:
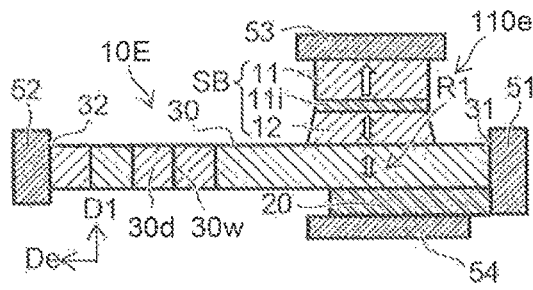

As shown in FIG. 7E, in the magnetic memory device 110*e*, the non-magnetic layer 20 contacts the first conductive portion 51. In the first direction D1, the second magnetic layer 12 does not overlap the non-magnetic layer 20. In the first direction D1, a part of second magnetic layer 12 overlaps the non-magnetic layer 20. Another part of the second magnetic layer 12 does not overlap the non-magnetic layer 20 in the first direction D1.

Figure 7F:
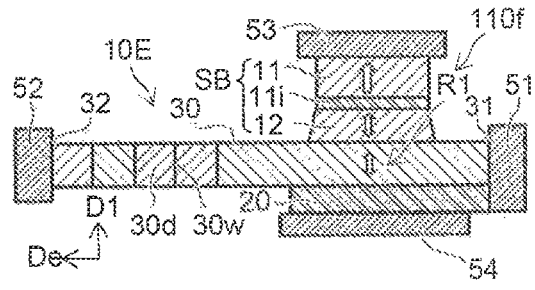

As shown in FIG. 7F, also in the magnetic memory device 110*f*, the non-magnetic layer 20 contacts the first conductive portion 51. In the first direction D1, the whole of the second magnetic layer 12 substantially overlaps the non-magnetic layer 20.

In the element unit 10E according to embodiment, various modifications are possible.

Figure 8:
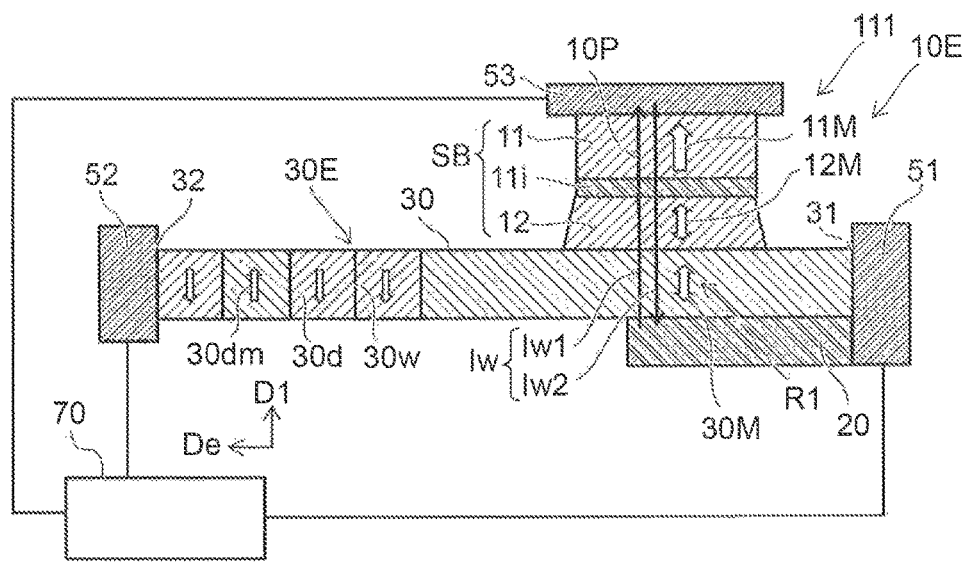
FIG. 8 is a schematic view illustrating another magnetic memory device according to the first embodiment.

FIG. 8 is a schematic view illustrating another magnetic memory device according to the first embodiment.

As shown in FIG. 8, the magnetic memory device 111 also includes the element unit 10E and the controller 70. The element unit 10E has a three terminal configuration. The non-magnetic layer 20 is electrically connected with the first conductive portion 51. Except for this, the magnetic memory device 111 is the same as the magnetic memory device 110.

In the magnetic memory device 111, the element unit 10E includes the first conductive portion 51, the second conductive portion 52, and the third conductive portion 53. The first conductive portion 51 is electrically connected with the first portion 31. The second conductive portion 52 is electrically connected with the second portion 32. The third conductive portion 53 is electrically connected with the first magnetic layer 11. The controller 70 is electrically connected with the first to third conductive portions 51-53. The writing current Iw can be reduced also in the magnetic memory device 111.

In the magnetic memory device 111, a part of second magnetic layer 12 overlaps the non-magnetic layer 20. Another part of the second magnetic layer 12 does not overlap the non-magnetic layer 20 in the first direction D1.

Figure 9A:
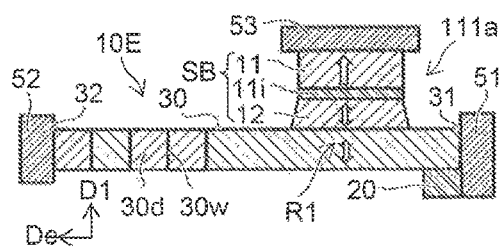
FIG. 9A to FIG. 9C are schematic views illustrating other magnetic memory devices according to the first embodiment.
Figure 9B:
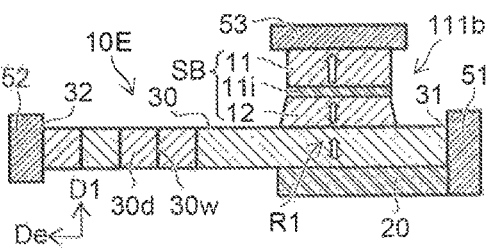
Figure 9C:
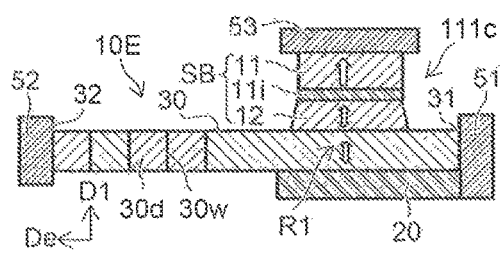

FIG. 9A to FIG. 9C are schematic views illustrating other magnetic memory devices according to the first embodiment.

As illustrate in FIG. 9A, in the magnetic memory device 111*a*, the second magnetic layer 12 does not overlap the non-magnetic layer 20 in the first direction D1.

As illustrate in FIG. 9B, in the magnetic memory device 111*b*, the whole of the second magnetic layer 12 substantially overlaps the non-magnetic layer 20 in the first direction D1.

As shown in FIG. 9C, in the magnetic memory device 111*c*, the distance (distance along the extending direction De) between the second magnetic layer 12 and the second portion 32 is shorter than the distance (distance along extending direction De) between the non-magnetic layer 20 and the second portion 32.

In the element unit 10E according to embodiment, various modifications are possible.

FIG. 10A and FIG. 10B are schematic views illustrating another magnetic memory device according to the first embodiment.

FIG. 10A is a schematic perspective view. FIG. 10B illustrates the sectional view of the element unit 10E. The controller 70 is omitted in FIG. 10A.

As shown in FIG. 10B, the magnetic memory device 112 also includes the element unit 10E and the controller 70. Hereinafter, portions of the magnetic memory device 112 which are different from the magnetic memory device 110 are described.

Also in the magnetic memory device 112, the element unit 10E includes the magnetic member 30, the first magnetic layer 11, the second magnetic layer 12, the intermediate layer 11*i*, and the non-magnetic layer 20. Also in this example, the magnetic member 30 includes the extending portion 30E. The extending portion 30E extends in the first direction D1. The extending direction De of the extending portion 30E is along the first direction D1.

The first region R1 of the magnetic member 30 overlaps a part of the extending portion 30E in the second direction D2. The second direction D2 crosses the first direction D1. The extending portion 30E has a tubular configuration extending in the first direction D1. The first region R1 is provided around a part of the extending portion 30E. The first region R1 contacts the first portion 31 of the magnetic member 30. The first region R1 is provided around the first portion 31.

The non-magnetic layer 20 is provided around another part of the extending portion 30E. In this example, the non-magnetic layer 20 contacts the first conductive portion 51.

The first conductive portion 51 is provided around the first region R1. Also in this case, the first conductive portion 51 is electrically connected with the first portion 31 through the first region R1.

Between the second conductive portion 52 and the third conductive portion 53, the first magnetic layer 11, the intermediate layer 11i, the second magnetic layer 12, and the magnetic member 30 are provided. The second conductive portion 52 is electrically connected with the second portion 32. The third conductive portion 53 is electrically connected with the first magnetic layer 11.

Also in the magnetic memory device 112, the writing operation described concerning the magnetic memory device 110 is performed. A writing current can be reduced also in the magnetic memory device 112.

Also in the magnetic memory device 112, the shift operation and the reading operation which are described concerning the magnetic memory device 110 are performed.

FIG. 11A and FIG. 11B are schematic views illustrating another magnetic memory device according to the first embodiment.

FIG. 11A is a schematic perspective view. FIG. 11B illustrates the sectional view of the element unit 10E. The controller 70 is omitted in FIG. 11A.

As shown in FIG. 11A and FIG. 11B, the magnetic memory device 113 also includes the element unit 10E and the controller 70. The element unit 10E includes the magnetic member 30, the first magnetic layer 11, the second magnetic layer 12, the intermediate layer ill, and the non-magnetic layer 20.

Also in the magnetic memory device 113, the magnetic member 30 includes the extending portion 30E. The extending portion 30E extends in the first direction D1. The extending direction De of the extending portion 30E is along the first direction D1. The extending portion 30E has a tubular configuration extending in the first direction D1.

The first region R1 overlaps a part of the extending portion 30E in a second direction D2. The second direction D2 crosses the first direction D1. In the magnetic memory device 113, the first region R1 protrudes from the extending portion 30E. The writing current can be reduced also in the magnetic memory device 113.

Figure 12:
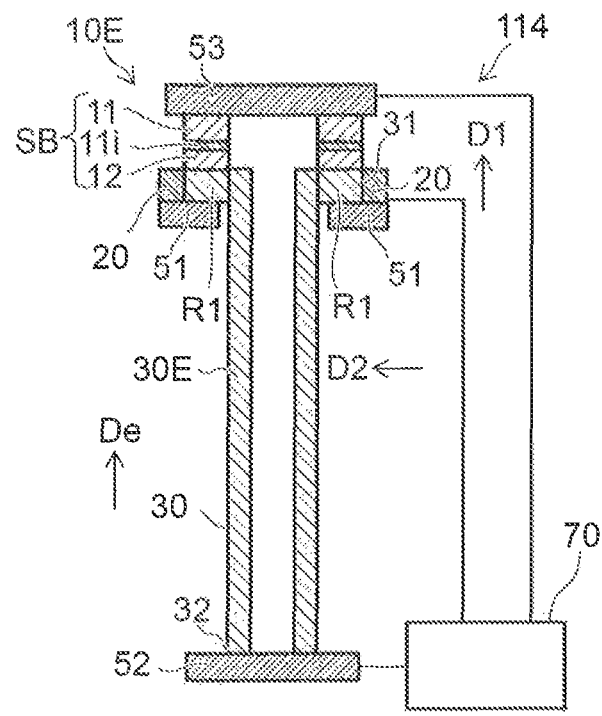
FIG. 12 is a schematic sectional view illustrating another magnetic memory device according to the first embodiment.

FIG. 12 is a schematic sectional view illustrating another magnetic memory device according to the first embodiment.

As shown in FIG. 12, the magnetic memory device 114 also includes the element unit 10E and the controller 70. The element unit 10E includes the magnetic member 30, the first magnetic layer 11, the second magnetic layer 12, the intermediate layer 11i, and the non-magnetic layer 20.

Also in the magnetic memory device 114, in the magnetic member 30, the extending portion 30E extending in the first direction D1 is provided.

The first region R1 of the magnetic member 30 is provided between a part of extending portion 30E and the non-magnetic layer 20 in a second direction D2. The second direction D2 crosses the first direction D1 (extending direction De). The extending portion 30E has a tubular configuration extending in the first direction D1.

For example, the first region R1 is provided around a part of the extending portion 30E. The non-magnetic layer 20 is provided around the first region R1. In this example, the first conductive portion 51 contacts the first region R1 and the non-magnetic layer 20. The writing current can be reduced also in the magnetic memory device 114.

Figure 13:
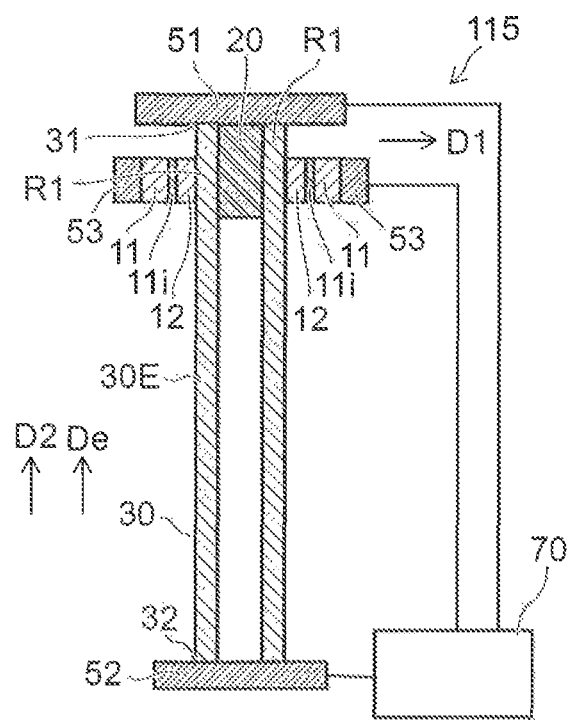
FIG. 13 is a schematic sectional view illustrating another magnetic memory device according to the first embodiment.

FIG. 13 is a schematic sectional view illustrating another magnetic memory device according to the first embodiment.

As shown in FIG. 13, the magnetic memory device 115 also includes the element unit 10E and the controller 70. The element unit 10E includes the magnetic member 30, the first magnetic layer 11, the second magnetic layer 12, the Intermediate layer 11i, and the non-magnetic layer 20.

In the magnetic memory device 115, the extending portion 30E of the magnetic member 30 has a tubular configuration extending in a second direction D2. The second direction D2 crosses the first direction D1. In this example, the first magnetic layer 11 is apart from the magnetic member 30 in the first direction D1 which crosses the extending direction De (the second direction D2) of the extending portion 30E.

In this example, the non-magnetic layer 20 is provided in the extending portion 30E having the tubular configuration. A part of extending portion 30E is provided around the non-magnetic layer 20. In a direction (for example, the first direction D1) crossing the second direction D2, the first region R1 of the magnetic member 30 is provided between the second magnetic layer 12 and the non-magnetic layer 20.

For example, the first region R1 is provided around the non-magnetic layer 20. The second magnetic layer 12 is provided around the first region R1. The intermediate layer 11 is provided around the second magnetic layer 12. The first magnetic layer 11 is provided around the intermediate layer 11i.

The third conductive portion 53 is provided around the first magnetic layer 11. The magnetic member 30 is provided between the first conductive portion 51 and the second conductive portion 52. The writing current can be reduced also in the magnetic memory device 115.

In the embodiment, the first magnetization 11M of the first magnetic layer 11 is substantially fixed. On the other hand, the direction of the second magnetization 12M of the second magnetic layer 12 can be changed. For example, when the current (for example, the writing current 1w) along the first direction D1 flows in the stacked body SB, the direction of the second magnetization 12M is changed. At this time, the direction of the first magnetization 11M does not change substantially. The first magnetization 11M is hardly changed relative to the second magnetization 12M. Thus, the first magnetic layer 11 has the first magnetization 11M being substantially fixed. On the other hand, the second magnetic layer 12 has the second magnetization 12M which can be changed.

For example, the thickness of the first magnetic layer 11 is thicker than the thickness of the second magnetic layer 12. The thickness of the first magnetic layer 11 is a length of the first magnetic layer 11 along the first direction D1. The thickness of the second magnetic layer 12 is a length of the second magnetic layer 12 along the first direction D1.

For example, the coercivity of the first magnetic layer 11 may be larger than the coercivity of the second magnetic layer 12. For example, the first magnetic layer 11 may have at least one of a first thickness thicker than a second thickness of the second magnetic layer 12, and a first coercivity larger than a second coercivity of the second magnetic layer 12. The first magnetic layer 11 functions as a magnetization reference layer, for example. The second magnetic layer 12 functions as a magnetization free layer, for example.

The first magnetization 11M crosses the extending direction De of the extending portion 30E, for example. The second magnetization 12M crosses the extending direction De of the extending portion 30E, for example. The first magnetic layer 11 and the second magnetic layer 12 are perpendicular magnetization films, for example.

The first magnetic layer 11 may include an alloy including at least one selected from a group consisting of Cobalt (Co) and Iron (Fe), for example. The first magnetic layer 11 may further includes at least one selected form a group consisting of Boron (B), Silver (Ag), Ruthenium (Ru), Tantalum (Ta), Tungsten (W), Platinum (Pt), Copper (Cu), Aluminum (Al), Magnesium (Mg), Nickel (Ni) Silicon (Si), Germanium (Ge), Iridium (Ir), and Manganese (Mn), for example.

The first magnetic layer 11 may has a synthetic antiferromagnetic configuration. In this case, the first magnetization 11M is the magnetization of the closest layer in the first magnetic layer 11 to the intermediate layer 11i. In the first magnetic layer 11 having the synthetic antiferromagnetic configuration, leak field is reduced.

The second magnetic layer 12 may include an alloy including at least one selected from a group consisting of Cobalt (Co) and Iron (Fe), for example. The second magnetic layer 12 may further includes at least one selected form a group consisting of Boron (B), Silver (Ag), Ruthenium (Ru), Tantalum (Ta), Tungsten (W), Platinum (Pt), Copper (Cu), Aluminum (Al), Magnesium (Mg), Nickel (Ni) Silicon (Si), Germanium (Ge), Iridium (Ir), and Manganese (Mn), for example.

The intermediate layer 11i includes at least one selected from a group consisting of oxide of Magnesium (Mg), nitride of Magnesium (Mg), oxide of aluminum (Al), and nitride of aluminum (Al), for example.

The magnetic member 30 includes may include an alloy including at least one selected from Cobalt (Co) and Iron, for example. The magnetic member 30 may further includes at least one selected from a group consisting of Boron (B), Silver (Ag), Ruthenium (Ru), Tantalum (Ta), Tungsten (W), Platinum (Pt), Copper (Cu), Aluminum (Al), Magnesium (Mg), Nickel (Ni) Silicon (Si), Germanium (Ge), Iridium (Ir), and Manganese (Mn), Gadolinium (Gd), and Terbium (Tb), for example.

The non-magnetic layer 20 includes at least one selected from the group consisting of tantalum, Bismuth-Tellurium alloy, and Chromium-Platinum-Manganese alloy, for example. Thereby, in the non-magnetic layer 20, heat is generated efficiently.

At least one of the first to fourth conductive portions 51-54 includes at least one selected from the group consisting copper, gold, tungsten, and aluminum, for example. Thereby, the electrical connection with low resistance is obtained.

Second Embodiment

Figure 14:
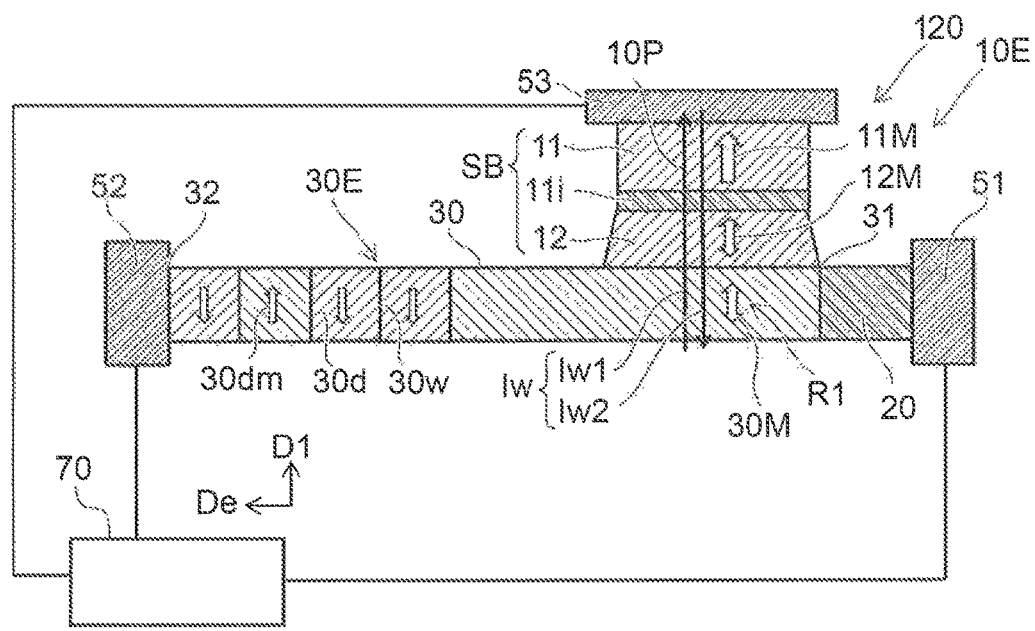
FIG. 14 is a schematic view illustrating the magnetic memory device according to the second embodiment.

FIG. 14 is a schematic view illustrating the magnetic memory device according to the second embodiment.

As shown in FIG. 14, the magnetic memory device 120 according to the embodiment includes the element unit 10E and the controller 70.

The element unit 10E includes the first conductive portion 51, the magnetic member 30, the first magnetic layer 11, the second magnetic layer 12, and the intermediate layer 11i. The magnetic member 30 includes the first region R1, the first portion 31, and the second portion 32. The first region R1 is provided between the first portion 31 and the second portion 32. Alternatively, the first region R1 is included in the first portion 31. In this example, the magnetic member 30 includes the extending portion 30E. The extending portion 30E extends along the extending direction De. In this example, the extending direction De crosses the first direction D1.

The non-magnetic layer 20 is provided between the first portion 31 and the first conductive portion 51. The non-magnetic layer 20 is electrically connected with the first portion 31 and the first conductive portion 51.

The electrical resistance of the non-magnetic layer 20 is higher than the electrical resistance in the first region R1 of the magnetic member 30. The electrical resistance of the non-magnetic layer 20 is higher than the electrical resistance of the first conductive portion 51.

The electrical resistance of the non-magnetic layer 20 is the electrical resistance of the non-magnetic layer 20 with respect to the current flowing between the first portion 31 and the first conductive portion 51, for example. The electrical resistance of the magnetic member 30 in the first region R1 is the electrical resistance of the magnetic member 30 in the first region R1 with respect to the current flowing between the first portion 31 and the second magnetic layer 12 for example. The electrical resistance of the first conductive portion 51 is the electrical resistance of the first conductive portion 51 with respect to the current flowing between the non-magnetic layer and the first conductive portion 51.

The first magnetic layer 11 is apart from the first region R1 In the first direction D1. The second magnetic layer 12 is provided between the first region R1 and the first magnetic layer 11. The intermediate layer 11i is provided between the first magnetic layer 11 and the second magnetic layer 12. The intermediate layer 1 is non-magnetic.

In this example, the second conductive portion 52 and the third conductive portion 53 are provided. The second conductive portion 52 is electrically connected with the second portion 32. The third conductive portion 53 is electrically connected with the first magnetic layer 11.

The controller 70 supplies the writing current Iw to the element unit 10E in the writing operation. The writing current Iw Is the first writing current Iw1 or the second writing current Iw2. The writing current Iw flows through the current path 10P including the first magnetic layer 11 and the non-magnetic layer 20.

The writing current Iw flows in the non-magnetic layer 20 also in the magnetic memory device 120. Thereby, the magnetization 30M of the first region R1 is changed easily. The writing current can be reduced also in the embodiment.

In the embodiment, the non-magnetic layer 20 includes at least one selected from the group consisting of tantalum, Bismuth-Tellurium alloy, and Chromium-Platinum-Manganese alloy. On the other hand, the first conductive portion 51 includes at least one selected from the group consisting copper, gold, tungsten, and aluminum. Thereby, in the non-magnetic layer 20 heat is generated efficiently. The heat generated in the non-magnetic layer 20 is transferred to the first region R1 efficiently.

The shift operation is performed also in the magnetic memory device 120. The controller 70 is electrically connected with the second portion 32 of the magnetic member 30. The controller 70 supplies the shift current Is (see FIG. 4A and FIG. 4E) to the element unit 10E. The shift current Is flows between the first portion 31 and the second portion 32.

The reading operation in the magnetic memory device 120 is the same as that of reading operation in the magnetic memory device 110, for example.

In the magnetic memory device 120, it is preferable that the non-magnetic layer 20 is located close to the first region R1 of the magnetic member 30. The writing is performed in the first region R1 efficiently. For example, the first region R1 overlaps the second magnetic layer 12 in the first direction D1. The first region R1 overlaps the first magnetic layer 11 in the first direction D1.

For example, the distance (shortest distance) between the non-magnetic layer 20 and the first region R1 is not less 0.5 times the distance between the first magnetic layer 11 and the first region R1. The distance between the non-magnetic layer and the first region R1 is the distance along the extending direction De. The distance between the first magnetic layer 11 and the first region R1 is the distance along the first direction D1. The distance (shortest distance) between the non-magnetic layer 20 and the first region R1 may be not more than ten times the distance between the first magnetic layer 11 and the first region R1. For example, the distance between the first magnetic layer 11 and the first region R1 may be not less than 2 nm and not more than 5 nm. For example, the distance between the first magnetic layer 11 and the first region R1 is not less than 1 nm and not more than 50 nm.

By a short distance between the non-magnetic layer 20 and the first region R1, the heat generated in the non-magnetic layer 20 is transferred to the first region R1 efficiently. Thereby, the writing current can be increased effectively.

Figure 15:
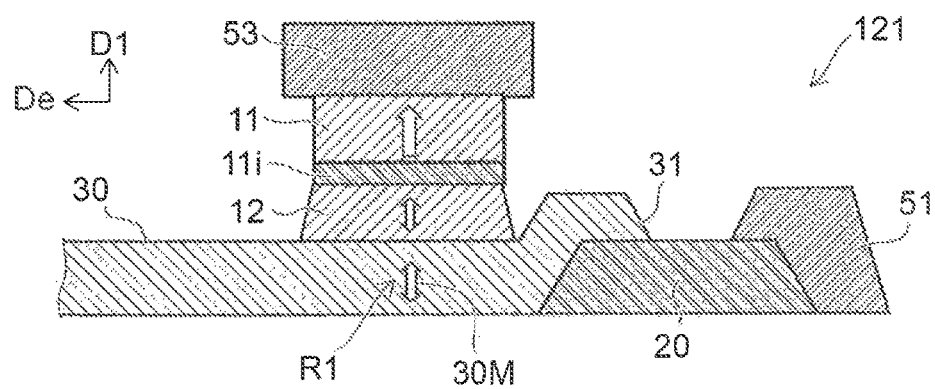
FIG. 15 is a schematic sectional view illustrating another magnetic memory device according to the second embodiment.

FIG. 15 is a schematic sectional view illustrating another magnetic memory device according to the second embodiment.

The controller 70 is omitted in FIG. 15. As shown in FIG. 15, in the magnetic memory device 121, the first portion 31 of the magnetic member 30 overlaps the non-magnetic layer 20 in the first direction D1. The first conductive portion 51 overlaps the non-magnetic layer 20 in the first direction D1. Electric connection between the magnetic member 30 and the first conductive portion 51 through the non-magnetic layer 20 is ensured.

In the second embodiment, the material and the composition which are described concerning the first embodiment are applicable to the first magnetic layer 11, the second magnetic layer 12, and the intermediate layer 11i.

Third Embodiment

Figure 16:
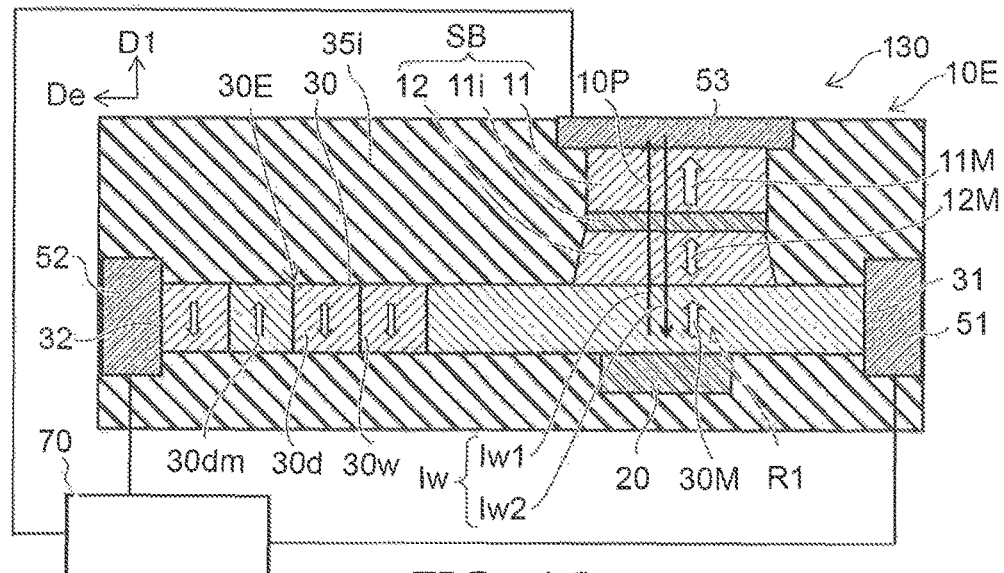
FIG. 16 is a schematic view illustrating the magnetic memory device according to a third embodiment.

FIG. 16 is a schematic view illustrating the magnetic memory device according to a third embodiment.

As shown in FIG. 16, the magnetic memory device 130 according to the embodiment includes the element unit 10E and the controller 70. Also in this example, the element unit 10E includes the magnetic member 30, the first magnetic layer 11, the second magnetic layer 12, the intermediate layer 11i, the non-magnetic layer 20, and the insulating member 35i.

The first magnetic layer 11 is apart from the first region R1 of the magnetic member 30 in the first direction D1. The second magnetic layer 12 is provided between the first region R1 and the first magnetic layer 11. The intermediate layer 11i is provided between the first magnetic layer 11 and the second magnetic layer 12. The intermediate layer 11i is non-magnetic.

The non-magnetic layer 20 is connected with the first region R1. For example, the non-magnetic layer 20 may contact at least a part of the first region R1. In this example, a part of second magnetic layer 12 overlaps the non-magnetic layer 20 in the first direction D1. Another part of the second magnetic layer 12 does not overlap the non-magnetic layer 20 in the first direction D1.

In this example, the position of the first region R1 in the first direction D1 is located between the position of the non-magnetic layer 20 in the first direction D1 and the position of the second magnetic layer 12 in the first direction D1. In this example, at least a part of the first region R1 is located between the non-magnetic layer 20 and the second magnetic layer 12.

The insulating member 35i is provided around the magnetic member 30, the first magnetic layer 11, the second magnetic layer 12, the intermediate layer 11i, and the non-magnetic layer 20.

The thermal conductivity of the non-magnetic layer 20 is lower than the thermal conductivity of the insulating member 35i. For example, the thermal conductivity of the non-magnetic layer 20 may be lower than the thermal conductivity of the magnetic member 30.

The controller 70 is electrically connected with the first magnetic layer 11 and the first region R1. The controller 70 supplies the writing current Iw to the element unit 10E. The writing current Iw flows through the current path 10P including the first magnetic layer 11 and the first region R1.

The writing current Iw does not need to flow through the non-magnetic layer 20 in this example. As mentioned above, the thermal conductivity of the non-magnetic layer 20 is lower than the thermal conductivity of the insulating member 35i. Therefore, the heat generated by the writing current Iw is accumulated in the non-magnetic layer 20, for example. For example, the magnetic member 30 has a portion (first region R1) near the non-magnetic layer 20. In this first region R1, heat is accumulated locally. Thereby, the temperature of the first region R1 increases locally. Thereby, the magnetization 30M in the first region R1 is changed easily. The writing current Iw can be reduced also in the magnetic memory device 130.

In the magnetic memory device 130, the non-magnetic layer 20 is provided near the first region R1. For example, the distance (shortest distance) between the non-magnetic layer 20 and the first region R1 is less than the distance between the first magnetic layer 11 and the first region R1. For example, it is preferable that the distance between the non-magnetic layer and the first region R1 is not more than 0.5 times the distance between the first magnetic layer 11 and the first region R1.

In this example, the first conductive portion 51, the second conductive portion 52, and the third conductive portion 53 are provided. The controller 70 is electrically connected with the first portion 31 (first region R1) of the magnetic member 30 through the first conductive portion 51. The controller 70 is electrically connected with the first magnetic layer 11 through the third conductive portion 53.

The controller 70 is further electrically connected with the first portion 31 of the magnetic member 30, and the second portion 32. The controller 70 is electrically connected with the second portion 32 through the second conductive portion 52. Thereby, also in the magnetic memory device 130, the shift operation (see FIG. 4A to FIG. 4F) is performed.

Also in this case, the first region R1 is located between the first portion 31 and the second portion 32. The first region R1 may be included in either the first portion 31 or the second portion 32. For example, the first region R1 may be included in the first portion 31.

The controller 70 supplies the shift current Is (see FIG. 4C and FIG. 4E) to the element unit 10E. The shift current Is flows between the first portion 31 and the second portion 32.

The reading operation in the magnetic memory device 130 is the same as that of reading operation in the magnetic memory device 110, for example.

In the embodiment, the non-magnetic layer 20 includes at least one selected from the group consisting of silicon oxide, silicon nitride, silicon oxynitride, and aluminum oxide, for example. The insulating member 35i includes at least one selected from the group consisting of silicon, Gallium Arsenide, or Germanium, and aluminum nitride, silicon carbide, and boron oxide, for example.

FIG. 17A to FIG. 17D are schematic views illustrating other magnetic memory devices according to the third embodiment.

Figures 17A, 17B:
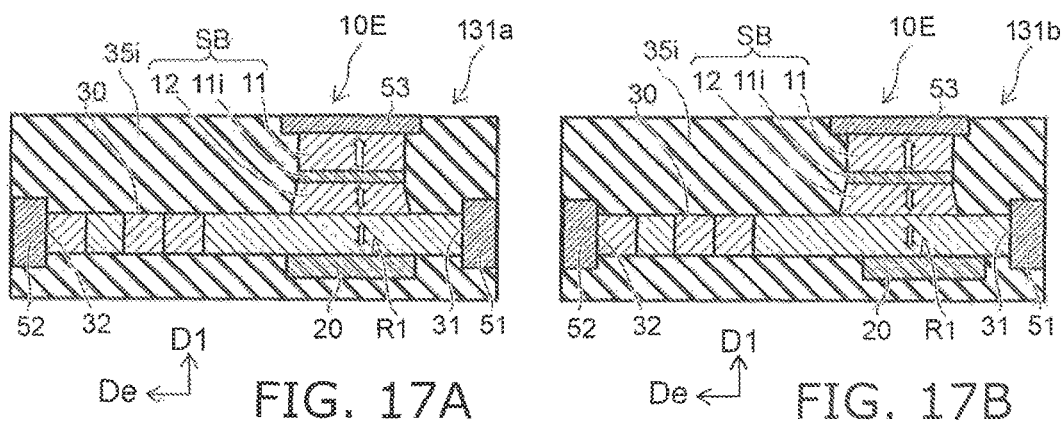
FIG. 17A to FIG. 17D are schematic views illustrating other magnetic memory devices according to the third embodiment.

As shown in FIG. 17A in the magnetic memory device 131a, the substantially whole of the second magnetic layer 12 overlaps the non-magnetic layer 20 in the first direction D1.

As shown in FIG. 17B, in the magnetic memory device 131b, a part of second magnetic layer 12 overlaps the non-magnetic layer 20 in the first direction D1. Another part of the second magnetic layer 12 does not overlap the non-magnetic layer 20 in the first direction D1. A part of non-magnetic layer 20 overlaps the second magnetic layer 12 in the first direction D1. Another part of the non-magnetic layer does not overlap the second magnetic layer 12 in the first direction D1.

Figures 17C, 17D:
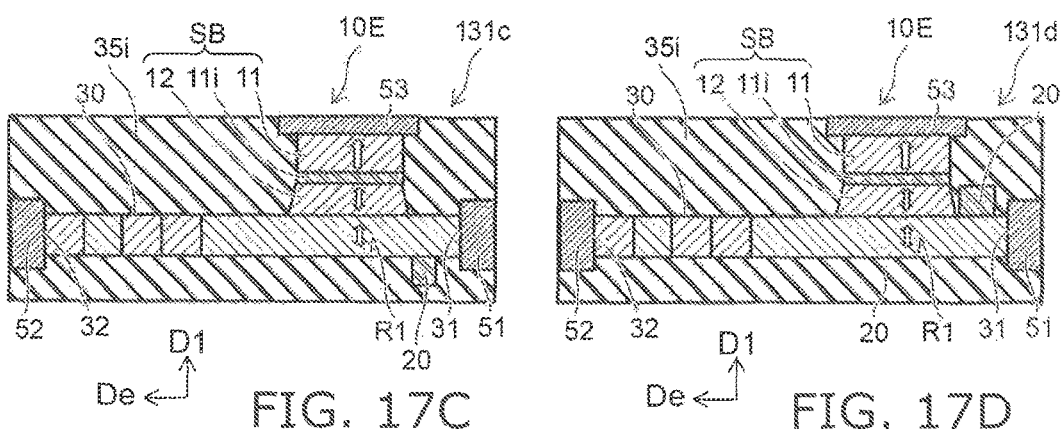

As shown in FIG. 17C, in the magnetic memory device 131c, the non-magnetic layer 20 does not overlap the second magnetic layer 12 in the first direction D1.

As shown in FIG. 17D, in the magnetic memory device 131d, the non-magnetic layer 20 overlaps the second magnetic layer 12 in a direction (for example, the extending direction De) crossing the first direction D1.

In the element unit 10E according to the embodiment, various modifications are possible.

Embodiments can include following configurations:

(Configuration 1) A magnetic memory device, comprising:
an element unit including
a magnetic member including a first region, a first portion, and a second portion, the first region being provided between the first portion and the second portion, or the first region being included in the first portion,
a first magnetic layer apart from the first region in a first direction,
a second magnetic layer provided between the first region and the first magnetic layer, an intermediate layer provided between the first magnetic layer and the second magnetic layer, the intermediate layer being non-magnetic, and
a non-magnetic layer connected with the first region; and
a controller configured to supply a writing current and a shift current to the element unit, the writing current passing a current path including the first magnetic layer and the non-magnetic layer, the shift current passing between the first portion and the second portion.

(Configuration 2) The device according to Configuration 1, wherein
a position of the first region in the first direction is located between a position of the non-magnetic layer in the first direction and a position of the second magnetic layer in the first direction.

(Configuration 3) The device according to one of Configurations 1 and 2, wherein
at least a part of the first region is located between the non-magnetic layer and the second magnetic layer.

(Configuration 4) The device according to one of Configurations 1-3, wherein
the magnetic member includes an extending portion extending along the first direction,
the first region overlaps a part of the extending portion in a direction crossing the first direction.

(Configuration 5) The device according to one of Configurations 1-3, wherein
the magnetic member includes an extending portion extending along the first direction, and
the first region is provided between a part of the extending portion and the non-magnetic layer in a direction crossing the first direction.

(Configuration 6) The device according to one of Configurations 4 and 5, wherein the first region is provided around the part of the extending portion.

(Configuration 7) The device according to one of Configurations 4-6, wherein the extending portion has a tubular configuration extending the first direction.

(Configuration 8) The device according to one of Configurations 1-3, wherein
the magnetic member includes an extending portion extending along a second direction crossing the first direction,
a part of the extending portion is provided around the non-magnetic layer, and
the first region is provided between the second magnetic layer and the non-magnetic layer in a direction crossing the second direction.

(Configuration 9) The device according to one of Configurations 1-7, wherein the element unit further includes:
a first conductive portion electrically connected with the first portion,
a second conductive portion electrically connected with the second portion,
a third conductive portion electrically connected with the first magnetic layer, and
a fourth conductive portion electrically connected with the non-magnetic member,
the controller is electrically connected with the first-fourth conductive portions.

(Configuration 10) The device according to one of Configurations 1-8, wherein the element unit further includes:
a first conductive portion electrically connected with the first portion,
a second conductive portion electrically connected with the second portion, and
a third conductive portion electrically connected with the first magnetic layer,
the controller is electrically connected with the first-third conductive portions,
the non-magnetic layer is electrically connected with the first conductive portion.

(Configuration 11) A magnetic memory device, comprising:
an element unit including
a first conductive portion,
a magnetic member including a first region, a first portion, and a second portion, the first region being provided between the first portion and the second portion, or the first region being included in the first portion,
a first magnetic layer apart from the first region in a first direction,
a second magnetic layer provided between the first region and the first magnetic layer, and
an intermediate layer provided between the first magnetic layer and the second magnetic layer, the intermediate layer being non-magnetic; and
a non-magnetic layer provided between the first portion and the first conductive portion and electrically connected with the first portion and the first conductive portion, an electrical resistance of the non-magnetic layer with respect to a current passing between the first portion and the first conductive portion being higher than an electrical resistance of the magnetic member with respect to a current passing between the first portion and the second magnetic layer, and being higher than an electrical resistance of the first conductive portion with respect to a current passing between the non-magnetic layer and the first conductive portion, a controller electrically connected with the first magnetic layer and the first conductive portion, the controller being configured to supply a writing current to the element unit, the writing current passing a current path including the first magnetic layer and the non-magnetic layer.

(Configuration 12) The device according to Configuration 11, wherein the non-magnetic layer includes at least one selected from the group consisting of tantalum, Bismuth-Tellurium alloy, and Chromium-Platinum-Manganese alloy, and the first conductive portion includes at least one selected from the group consisting of copper, gold, tungsten, and aluminum.

(Configuration 13) The device according to one of Configurations 11 and 12, wherein the controller is further electrically connected with the second portion, the controller supplies a shift current to the element unit, and the shift current passes between the first portion and the second portion.

(Configuration 14) A magnetic memory device, comprising:

an element unit including
a magnetic member,
a first magnetic layer apart from a first region of the magnetic member in a first direction,
a second magnetic layer provided between the first region and the first magnetic layer, and
an intermediate layer provided between the first magnetic layer and the second magnetic layer, the intermediate layer being non-magnetic
a non-magnetic layer connected with the first region, and
an insulating member provided around the magnetic member, the first magnetic layer, the second magnetic layer, the Intermediate layer, and the non-magnetic layer, a thermal conductivity of the non-magnetic layer being lower than a thermal conductivity of the insulating member; and
a controller electrically connected with the first magnetic layer and the first region, the controller being configured to supply a writing current to the element unit, the writing current passing a current path including the first magnetic layer and the first region.

(Configuration 15) The device according to Configuration 14, wherein the thermal conductivity of the non-magnetic layer is lower than a thermal conductivity of the magnetic member.

(Configuration 16) The device according to one of Configurations 14 and 15, wherein the controller is further electrically connected with a second portion and a second portion of the magnetic member, the first region is provided between the first portion and the second portion, or the first region is included in one of the first portion or the second portion, the controller supplies a shift current to the element unit, and the shift current passes between the first portion and the second portion.

(Configuration 17) The device according to one of Configurations 1-16, wherein the controller supplies a reading current to the element unit, the reading current passes a current path including the first magnetic layer and the first region, and the reading current is smaller than the writing current.

(Configuration 18) The device according to one of Configurations 1-17, wherein a magnetization of the first region changes depending on a direction of the writing current.

(Configuration 19) The device according to one of Configurations 1-18, wherein in at least a part of a period when the writing current flows, a temperature (° C.) of the first region is not less than 0.5 times of the Curie temperature (° C.) of the magnetic member.

(Configuration 20) The device according to one of Configurations 1-19, wherein a plurality of magnetic domains are formable in the magnetic member.

According to the embodiment, the magnetic memory device which can reduce the writing current can be provided.

In the specification of the application, a state of "electrically connected" includes a state where a plurality of electric conductors contact physically with each other and current flows between the plurality of electric conductors. A state of "electrically connected" includes a state where another electric conductor is inserted between the plurality of electric conductors and current flows between the plurality electric conductors. A state of "electrically connected" includes a state where an electric element (switch element, such as a transistor etc.) is inserted between the plurality of electric conductors and a state where current flows between the plurality of electric conductors can be formed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory devices such as magnetic members, magnetic layers, intermediate layers, non-magnetic layers, conductive portions, insulating members, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   an element unit including
   a magnetic member including a first region, a first portion, and a second portion, the first region being provided between the first portion and the second portion, or the first region being included in the first portion,
   a first magnetic layer apart from the first region in a first direction,
   a second magnetic layer provided between the first region and the first magnetic layer,
   an intermediate layer provided between the first magnetic layer and the second magnetic layer, the intermediate layer being non-magnetic, and
   a non-magnetic layer connected with the first region; and
   a controller configured to supply a writing current and a shift current to the element unit, the writing current passing a current path including the first magnetic layer and the non-magnetic layer, the shift current passing between the first portion and the second portion.

2. The device according to claim 1, wherein
   a position of the first region in the first direction is located between a position of the non-magnetic layer in the first direction and a position of the second magnetic layer in the first direction.

3. The device according to claim 1, wherein
   at least a part of the first region is located between the non-magnetic layer and the second magnetic layer.

4. The device according to claim 1, wherein
   the magnetic member includes an extending portion extending along the first direction, and
   the first region overlaps a part of the extending portion in a direction crossing the first direction.

5. The device according to claim 1, wherein
   the magnetic member includes an extending portion extending along the first direction, and
   the first region is provided between a part of the extending portion and the non-magnetic layer in a direction crossing the first direction.

6. The device according to claim 4, wherein the first region is provided around the part of the extending portion.

7. The device according to claim 4, wherein the extending portion has a tubular configuration extending the first direction.

8. The device according to claim 1, wherein
   the magnetic member includes an extending portion extending along a second direction crossing the first direction, the extending portion being tubular,
   a part of the extending portion is provided around the non-magnetic layer, and
   the first region is provided between the second magnetic layer and the non-magnetic layer in a direction crossing the second direction.

9. The device according to claim 1, wherein
   the element unit further includes
   a first conductive portion electrically connected with the first portion,
   a second conductive portion electrically connected with the second portion,
   a third conductive portion electrically connected with the first magnetic layer, and
   a fourth conductive portion electrically connected with the non-magnetic layer,
   the controller is electrically connected with the first to fourth conductive portions.

10. The device according to claim 1, wherein
    the element unit further includes
    a first conductive portion electrically connected with the first portion,
    a second conductive portion electrically connected with the second portion, and
    a third conductive portion electrically connected with the first magnetic layer,
    the controller is electrically connected with the first to third conductive portions, and
    the non-magnetic layer is electrically connected with the first conductive portion.

11. A memory device comprising:
    an element unit including
    a first conductive portion,
    a magnetic member, the magnetic member including a first region, a first portion and a second portion, the first region being provided between the first portion and the second portion, or the first region being included in the first portion,
    a first magnetic layer apart from the first region in a first direction,
    a second magnetic layer provided between the first region and the first magnetic layer, and
    an intermediate layer provided between the first magnetic layer and the second magnetic layer, the intermediate layer being non-magnetic
    a non-magnetic layer provided between the first portion and the first conductive portion and electrically connected with the first portion and the first conductive portion, an electrical resistance of the non-magnetic layer with respect to a current passing between the first portion and the first conductive portion being higher than an electrical resistance of the magnetic member with respect to a current passing between the first portion and the second magnetic layer, and being higher than an electrical resistance of the first conductive portion with respect to a current passing between the non-magnetic layer and the first conductive portion; and
    a controller electrically connected with the first magnetic layer and the first conductive portion, the controller being configured to supply a writing current to the element unit, the writing current passing a current path including the first magnetic layer and the first region.

12. The device according to claim 11, wherein
    the non-magnetic layer includes at least one selected from the group consisting of tantalum, Bismuth-Tellurium alloy, and Chromium-Platinum-Manganese alloy, and
    the first conductive portion includes at least one selected from the group consisting of copper, gold, tungsten, and aluminum.

13. The device according to claim 11, wherein
    the controller is further electrically connected with the second portion,
    the controller supplies a shift current to the element unit, and
    the shift current passes between the first portion and the second portion.

14. A magnetic memory device comprising:
an element unit including
   a magnetic member,
   a first magnetic layer apart from a first region of the magnetic member in a first direction,
   a second magnetic layer provided between the first region and the first magnetic layer, and
   an intermediate layer provided between the first magnetic layer and the second magnetic layer, the intermediate layer being non-magnetic
   a non-magnetic layer connected with the first region, and
   an insulating member provided around the magnetic member, the first magnetic layer, the second magnetic layer, the intermediate layer, and the non-magnetic layer, a thermal conductivity of the non-magnetic layer being lower than a thermal conductivity of the insulating member; and
a controller electrically connected with the first magnetic layer and the first region, the controller being configured to supply a writing current to the element unit, the writing current passing a current path including the first magnetic layer and the first region.

15. The device according to claim 14, wherein
the thermal conductivity of the non-magnetic layer is lower than a thermal conductivity of the magnetic member.

16. The device according to claim 14, wherein
the controller is further electrically connected with a first portion and a second portion of the magnetic member,
the first region is provided between the first portion and the second portion, or the first region is included in one of the first portion or the second portion
the controller supplies a shift current to the element unit, and
the shift current passes between the first portion and the second portion.

17. The device according to claim 1, wherein
the controller supplies a reading current to the element unit,
the reading current passes a current path including the first magnetic layer and the first region, and
the reading current is smaller than the writing current.

18. The device according to claim 1, wherein
a magnetization of the first region changes depending on a direction of the writing current.

19. The device according to claim 1, wherein
in at least a part of a period when the writing current flows, a temperature (° C.) of the first region is not less than 0.5 times of a Curie temperature (° C.) of the magnetic member.

20. The device according to claim 1, wherein
a plurality of magnetic domains are formable in the magnetic member.

* * * * *